United States Patent [19]

Koenck et al.

[11] Patent Number: 5,493,199
[45] Date of Patent: Feb. 20, 1996

[54] FAST BATTERY CHARGER

[75] Inventors: Steven E. Koenck; Phillip Miller; Ronald D. Becker, all of Cedar Rapids, Iowa

[73] Assignee: Norand Corporation, Cedar Rapids, Iowa

[21] Appl. No.: 957,470

[22] Filed: Oct. 6, 1992

Related U.S. Application Data

[63] Continuation of Ser. No. 478,180, Feb. 9, 1990, abandoned, and a continuation-in-part of Ser. No. 837,658, Feb. 18, 1992, and Ser. No. 769,337, Oct. 1, 1991, Pat. No. 5,278,487, said Ser. No. 837,658is a continuation-in-part of Ser. No. 769,337, Ser. No. 478,180, and Ser. No. 446,231, Dec. 5, 1989, abandoned, said Ser. No. 769,337is a continuation-in-part of Ser. No. 544,230, Jun. 26, 1990, abandoned, Ser. No. 478,180, Feb. 9, 1990, abandoned, and Ser. No. 446,231, said Ser. No. 544,230is a continuation-in-part of Ser. No. 478,180, Feb. 9, 1990, abandoned, Ser. No. 446,231, Ser. No. 422,226, Oct. 16, 1989, Pat. No. 4,961,043, and Ser. No. 266,537, Nov. 2, 1988, abandoned, said Ser. No. 478,180is a continuation-in-part of Ser. No. 446,231, Ser. No. 422,226, and Ser. No. 266,537, said Ser. No. 446,231is a continuation-in-part of Ser. No. 422,226, Ser. No. 266,537, and Ser. No. 168,352, Mar. 15, 1988, Pat. No. 4,885,523, said Ser. No. 422,226is a continuation-in-part of Ser. No. 266,537, and Ser. No. 168,352, said Ser. No. 266,537, is a division of Ser. No. 168,352, which is a continuation-in-part of Ser. No. 944,503, Dec. 18, 1986, Pat. No. 4,737,702, which is a continuation-in-part of Ser. No. 876,194, Jun. 19, 1986, Pat. No. 4,709,202, and Ser. No. 797,235, Nov. 12, 1985, Pat. No. 4,716,354, which is a continuation-in-part of Ser. No. 612,588, May 21, 1984, Pat. No. 4,553,081, which is a continuation-in-part of Ser. No. 385,830, Jun. 7, 1982, Pat. No. 4,455,523.

[51] Int. Cl.[6] .................................................. H02J 7/10
[52] U.S. Cl. ...................................... 320/35; 320/31
[58] Field of Search ........................................ 320/35

[56] References Cited

U.S. PATENT DOCUMENTS

| | | | |
|---|---|---|---|
| 3,599,071 | 8/1971 | Lapuyade et al. | 320/35 |
| 3,917,990 | 11/1975 | Sherman, Jr. | 320/35 |
| 4,125,802 | 11/1978 | Godard | 320/35 |
| 4,237,411 | 12/1980 | Köthe et al. | 320/35 X |
| 4,370,606 | 1/1983 | Kakumoto et al. | 320/35 |
| 4,424,476 | 1/1984 | Mullersman | 320/36 |
| 4,670,703 | 6/1987 | Williams | 320/31 X |
| 4,692,682 | 9/1987 | Lane et al. | 320/35 |
| 4,833,390 | 5/1989 | Kumada et al. | 320/2 |
| 5,013,993 | 5/1991 | Bhagwat et al. | 320/35 |

FOREIGN PATENT DOCUMENTS

| | | |
|---|---|---|
| 2520599 | 11/1976 | Germany . |
| WO-A-8902182 | 3/1989 | WIPO . |

*Primary Examiner*—Steven L. Stephan
*Assistant Examiner*—Nicholas Ponomarenko
*Attorney, Agent, or Firm*—Zarley, McKee, Thomtee, Vorhees & Sease

[57] ABSTRACT

In an exemplary fast charging system, a hand-held computerized terminal with rechargeable batteries therein may be bodily inserted into a charger receptacle. The terminal may have volatile memory and other components requiring load current during charging. The system may automatically identify battery type and automatically adjust to different levels of load current. The battery temperature may be brought into a relationship to surrounding temperature such that by applying a suitable overcharge current value and observing any resultant temperature increase, the level of remaining battery charge can be determined. For example, if the battery is found to be relatively fully discharged, a relatively high fast-charge rate may be safely applied while monitoring battery temperature. If the battery is initially relatively fully charged or reaches such a state during fast charge, the system may automatically dynamically select a maintenance charge rate according to battery type and temperature. A preferred system may automatically recharge the batteries of a portable device according to an optimum schedule of essentially maximum safe charging rates as a function of battery temperature, and thereafter safely maintain the batteries at essentially fully charged condition in readiness for maximum duration portable operation.

53 Claims, 10 Drawing Sheets

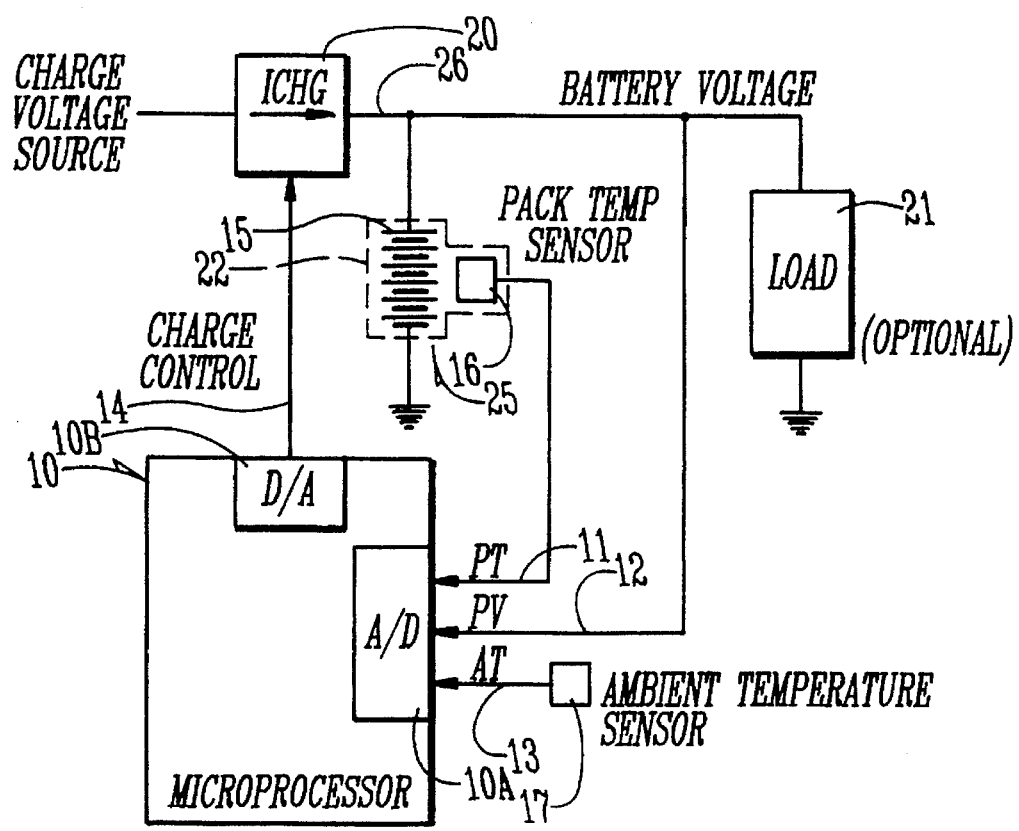

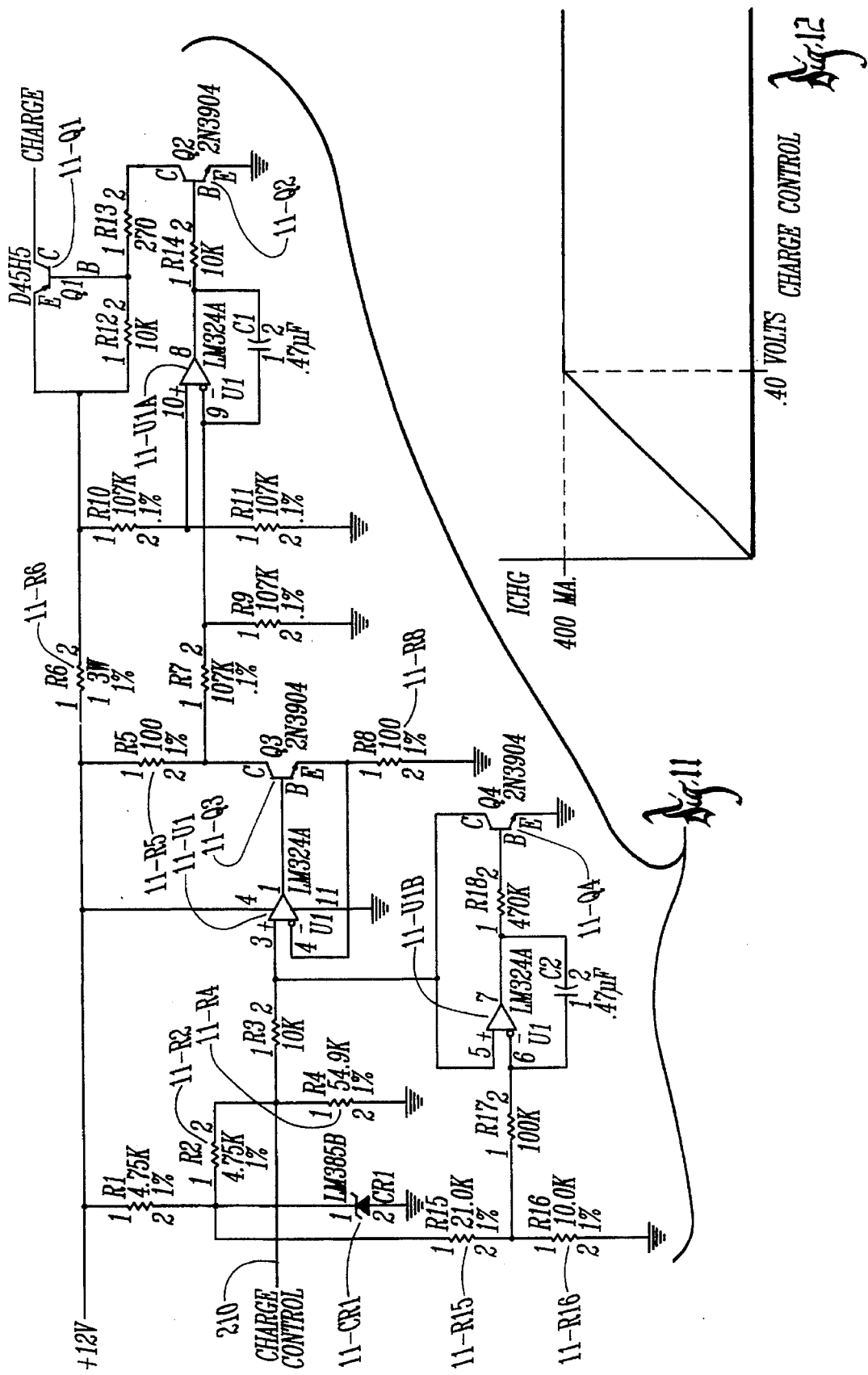

FAST BATTERY CHARGER

CROSS-REFERENCE TO RELATED APPLICATIONS

This application is a continuation of application Ser. No. 07/478,180 filed Feb. 9, 1990, now abandoned, and is a continuation-in-part of Ser. No. 07/837,658 filed Feb. 18, 1992 and Ser. No. 07/769,337 filed Oct. 1, 1991, now U.S. Pat. No. 5,278,487.

Said application Ser. No. 07/837,658 is a continuation-in-part of application Ser. No. 07/769,337, Ser. No. 07/478,180, and Ser. No. 07/446,231 filed Dec. 5, 1989, now abandoned.

Said application Ser. No. 07/769,337 is a continuation-in-part of applications Ser. No. 07/544,230 filed Jun. 26,1990, now abandoned, Ser. No. 07/478,180 filed Feb. 9, 1990, now abandoned, and Ser. No. 07/446,231 filed Dec. 5, 1989, now abandoned.

Said Ser. No. 07/544,230 is a continuation-in-part of applications Ser. No. 07/478,180 filed Feb. 9, 1990, now abandoned, Ser. No. 07/446,231 filed Dec. 5, 1989, now abandoned, Ser. No. 07/422,226 filed Oct. 16, 1989, now U.S. Pat. No. 4,961,043, and Ser. No. 07/266,537 filed Nov. 2, 1988, now abandoned.

Said Ser. No. 07/478,180 filed Feb. 9, 1990 is a continuation-in-part of applications Ser. No. 07/446,231 filed Dec. 5, 1989, now abandoned, Ser. No. 07/422,226 filed Oct. 16, 1989, now U.S. Pat. No. 4,961,043, and Ser. No. 07/266,537 filed Nov. 2, 1988, now abandoned.

Said Ser. No. 07/446,231 filed Dec. 5, 1989 is a continuation-in-part of applications Ser. No. 07/422,226 filed Oct. 16, 1989, now U.S. Pat. No. 4,961,043, Ser. No. 07/266,537 filed Nov. 2, 1988, now abandoned, and Ser. No. 07/168,352 filed Mar. 15, 1988 now U.S. Pat. No. 4,885,523.

Said Ser. No. 07/422,226 filed Oct. 16, 1989 is a continuation-in-part of applications Ser. No. 07/266,537 filed Nov. 2, 1988, now abandoned, and Ser. No. 07/168,352 filed Mar. 15, 1988, now U.S. Pat. No. 4,885,523.

Said Ser. No. 07/266,537 filed Nov. 2, 1988 which is a division of Ser. No. 07/168,352 filed Mar. 15, 1988, now U.S. Pat. No. 4,885,523, which is a continuation-in-part of Ser. No. 06/944,503 filed Dec. 18, 1986, now U.S. Pat. No. 4,737,702 is a continuation-in-part of applications Ser. No. 876,194 filed Jun. 19, 1986, now U.S. Pat. No. 4,709,202, and U.S. Ser. No. 797,235 filed Nov. 12, 1985, now U.S. Pat. No. 4,716,354.

Said Ser. No. 876,194 is a division of U.S. Ser. No. 797,235 filed Nov. 12, 1985, now U.S. Pat. No. 4,716,354, which is a continuation-in-part of application Ser. No. 612,588 filed May 21, 1984, now U.S. Pat. No. 4,553,081, which is a continuation-in-part of Ser. No. 385,830 filed Jun. 7, 1982, now U.S. Pat. No. 4,455,523.

INCORPORATION BY REFERENCE

The disclosures and drawings of the above-mentioned U.S. Pat. Nos. 4,455,523, 4,553,081, 4,737,702, and 4,885,523, and of the pending applications U.S. Ser. No. 07/266,537, U.S. Ser. No. 07/837,650 (filed Feb. 18, 1992), and U.S. Ser. 07/446,231 are hereby incorporated herein by reference in their entirety.

BACKGROUND OF THE INVENTION

NiCad (nickel-cadmium) battery technology has been employed successfully in portable hand-held applications for many years. Photographic equipment, power tools, data terminals, personal radio transceivers and pagers commonly utilize NiCad batteries as a power source. The charging systems that have been provided with these products have ranged from a simple transformer/rectifier type to rather complex systems to monitor and control the charging function. An increasing need is the ability to charge NiCad batteries quickly. To reliably and efficiently charge NiCad batteries at high rates requires careful control of the charging operation to avoid damage to the cells, particularly under extreme ambient temperature conditions.

The NiCad charge cycle consists of two basic parts: the coulombic portion and the overcharge portion. The coulombic portion of the charge cycle is characterized by the fact that most of the charge that is applied to the battery is stored in the form of electrochemical energy. This portion of the charge cycle is slightly endothermic, consequently high charge currents may be applied during this time without resulting in temperature increase, most of the available battery capacity is stored during the coulombic portion of the charge cycle. The overcharge portion of the charge cycle is characterized by the fact that most of the applied charge current causes generation of oxygen gas at the positive electrode of the NiCad cell, with only a relatively small amount of charge actually being stored in the cell. The released oxygen chemically recombines with cadmium at the negative electrode of the cell which serves to equalize the internal pressure of the cell. If the overcharge rate is too high, the rate of oxygen recombination may be insufficient to prevent excessive internal pressure and cell venting, which drastically reduces the useful life of the cell.

The most critical factors in determining the maximum allowable charge current that may be safely applied to a NiCad battery are temperature and state of charge. At low temperatures the oxygen recombination rate is significantly reduced which limits the allowable overcharge current that may be applied without venting the cells if they are fully charged. At high temperatures the heat released by the oxygen recombination reaction may cause excessive cell temperature to be experienced leading to premature failure of the plate separator material and subsequent short-circuiting.

If the battery is fully discharged, minimal oxygen generation will occur until the battery nears the fully charged condition. If the battery is nearly fully charged, it will quickly enter the overcharge condition and begin oxygen generation. The difficulty lies in accurate determination of the previous state of charge to avoid damage to the battery.

As portable hand-held data and radio terminals continue to be used more widely in certain demanding applications, the need for fast charging of the terminal batteries becomes more significant. The increased use of high powered scanner attachments and peripherals as well as other connected devices often causes the terminal battery capacity to be taxed to the point where only a portion of the intended period of usage may be served with the stored charge available from a single battery pack. Consequently, it has become increasingly necessary to provide multiple packs which may be exchanged in such a way that a depleted pack may be replaced by a fresh one with minimal downtime. When a depleted pack is removed, it should be fully recharged in at least the amount of time that a fresh pack is able to operate the terminal. With a recharging capability of this type, it is then possible for virtually perpetual operation to be provided with as few as two battery packs per terminal.

A similar but further complicated application involves the utilization of the described data terminals on a vehicle such as an industrial forklift truck. In this type of application, the terminal may receive power for operation from the vehicle the majority of the time. Often, however, it may be necessary for the terminal to be physically removed from the vehicle and operated in a fully portable mode for potentially extended periods of time. For this reason, it is highly advantageous to maintain the terminal batteries substantially at their fully charged or "topped off" state while they remain on board the vehicle.

SUMMARY OF THE INVENTION

A basic objective of the present invention is to provide a monitoring and control system which provides for effective fast charging. In order to avoid damage to the battery, the system automatically tests to determine the initial state of charge and selects the charging rate accordingly.

In a preferred implementation, a microprocessor receives measures of battery temperature and battery terminal voltage and selects an optimum charging rate. A unique feature of the preferred system is its ability to provide a safe controlled charge to a NiCad battery or to a battery of a similar type without sensing the current flow through the battery directly. This allows the effective battery impedance to be held at a minimum, thereby delivering the maximum available battery energy to the load.

Further features of the preferred system relate to the automatic processing of batteries subject to temperature extremes beyond the range where rapid charging operation is normally permitted, while safeguarding optimum battery life.

Further objects relate to the provision of an improved battery conditioning system and method wherein batteries are safely maintained at optimum charge automatically, while accommodating repeated removal of the batteries from the charging system for varying periods of portable use, and providing automatic quick and efficient recharging after use at a wide range of temperatures.

In accordance with a feature of the improved battery conditioning system, the differential between ambient temperature and battery temperature is used to select between fast charge mode, and a battery conditioning mode wherein the battery temperature is adjusted relative to ambient temperature. Preferably during such adjustment a moderate current is applied not exceeding a safe overcharge value but generally sufficient to compensate for any battery load. Such value of maintenance current may be selected according to self-identification by the battery pack or may be dynamically adjusted according to battery load current and minimum safe overcharge current for the battery temperature.

According to another feature of the improved battery conditioning system, a measure of battery voltage is obtained, e.g. after use of the above feature to equalize battery temperature and ambient temperature. A moderate current is then applied not exceeding any minimum safe overcharge value and any needed load current, and the current value is then dynamically adjusted so that battery voltage is maintained generally equal to the measured value, e.g. until battery temperature is in a range suited to fast charge operation.

The invention will now be described, by way of example and not by way of limitation, with references to the accompanying sheets of drawings; and other objects, features and advantages of the invention will be apparent from this detailed disclosure and from the appended claims.

BRIEF DESCRIPTION OF THE DRAWINGS

FIG. 1 is a block diagram illustration of an embodiment of fast charging system in accordance with the present disclosure.

FIG. 9 also shows successive approximate slope values by means of straight lines covering successive equal time intervals of 600 seconds.

FIG. 11 is a schematic diagram for illustrating a charge current regulator circuit such as indicated generally in FIG. 1.

FIG. 12 shows the voltage to current transfer function for the circuit of FIG. 11.

DESCRIPTION OF FIGS. 1 through 5

A block diagram of a charging system is shown in FIG. 1. A microprocessor 10 is preferably of a type that has analog to digital inputs such as 11 to 13 and digital to analog outputs such as 14 for interface to sensor and control functions. Both the temperature of battery 15 and ambient temperature are sensed an indicated at 16 and 17 so that absolute and relative temperature measurements may be made. The terminal voltage of the battery pack is sensed as indicated at 12 so that charge trends may be determined. The charge regulator is comprised of a voltage controlled current source 20 whose output current (Ichg) is controlled by the level of the charge control signal at 14 from the microprocessor. A load 21 may or may not be connected during charge.

In the microprocessor 10, analog to digital (A/D) means and digital to analog (D/A) means are indicated at 10A and 10B. Preferably these means are integrated with the other components of the microprocessor as part of a monolithic unit or "chip" formed from a unitary substrate of semiconductor material.

Figure 2A:
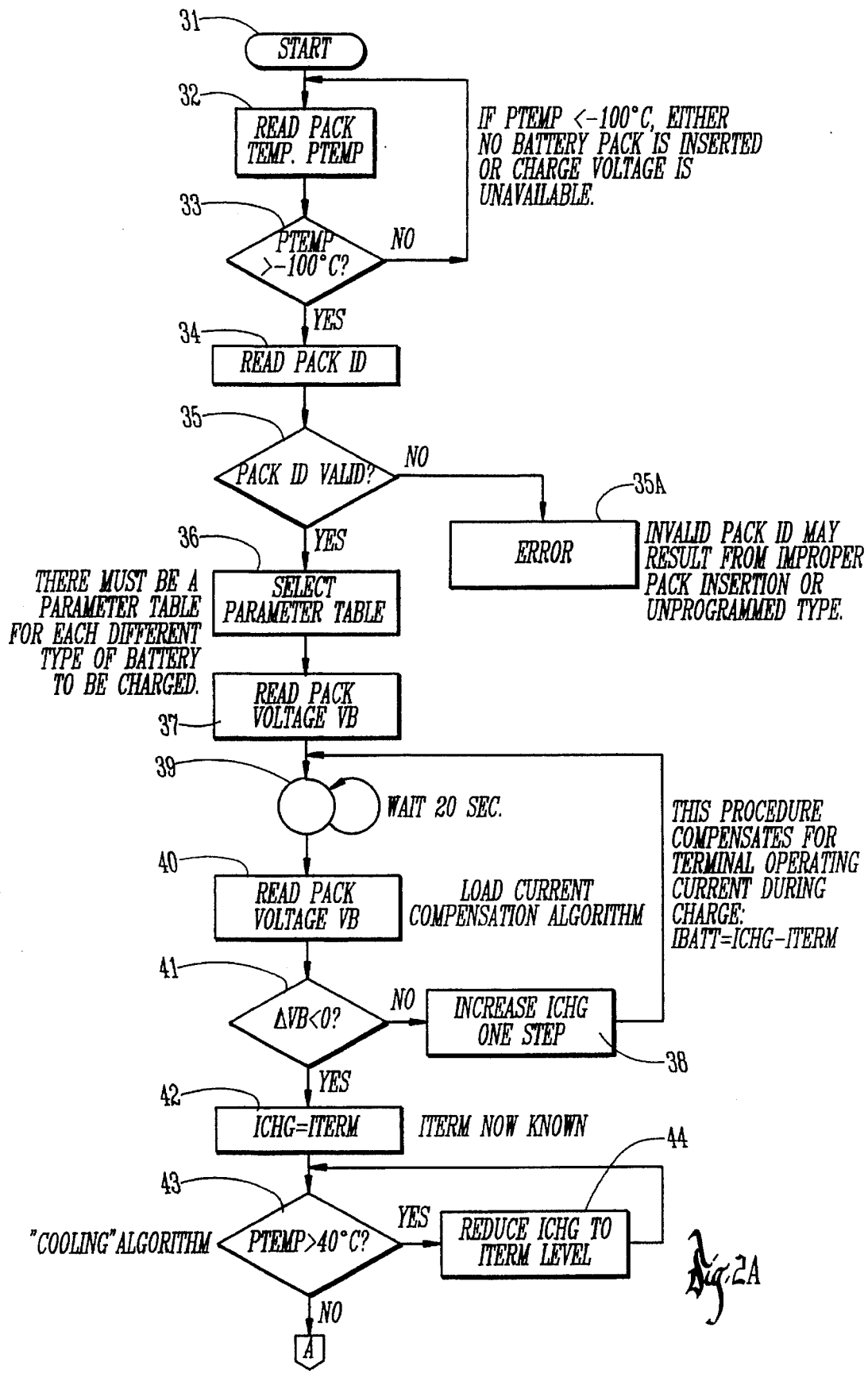
FIGS. 2A and 2B show a flow diagram for illustrating a fast charging method for implementation using a correspondingly programmed microprocessor in the system of FIG. 1.
Figure 2B:
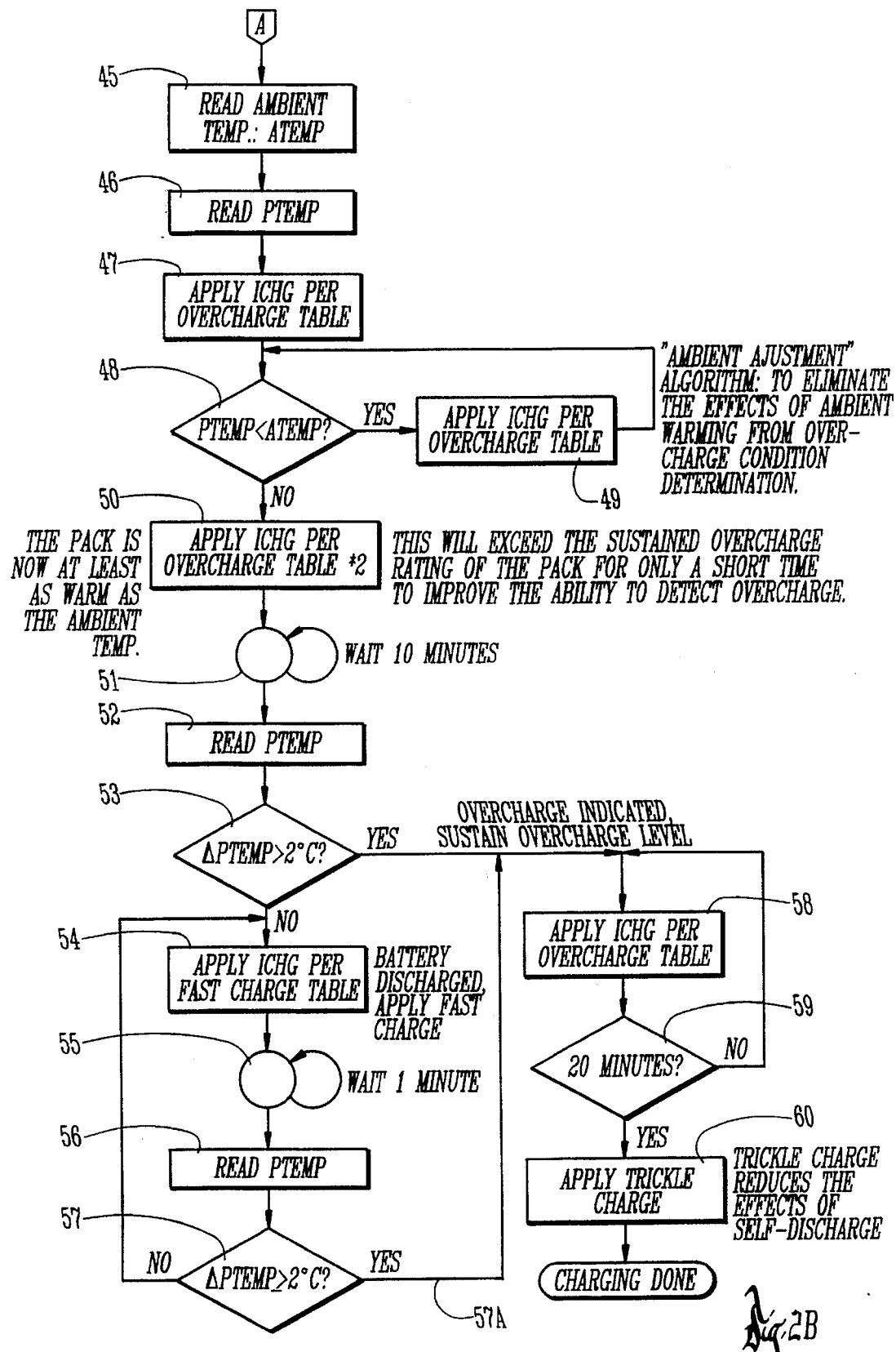

With a charging system as shown in FIG. 1, a control method has been developed for fast charging of NiCad batteries as shown in FIGS. 2A and 2B. The charging function is initiated as represented by "start" at 31 e.g. by placing the battery 15 in the charger. The temperature sensor 16 is preferably in a housing 22 which together with battery 15 forms the battery pack 25. The sensor 16 is preferably of the type whose output is proportional to absolute temperature e.g. at the rate of ten millivolts per degree Kelvin (10 mv/° K.). The microprocessor 10 tests for insertion of the battery in the charger by reading the temperature PT (Ptemp as indicated at 32), and checking to determine if Ptemp shows a temperature greater than $-100°$ C.; see decision block 33. The decision at block 33 will be affirmative only if a battery pack has been inserted to provide a non-zero voltage on the Ptemp (PT) signal line 11.

Figure 3:
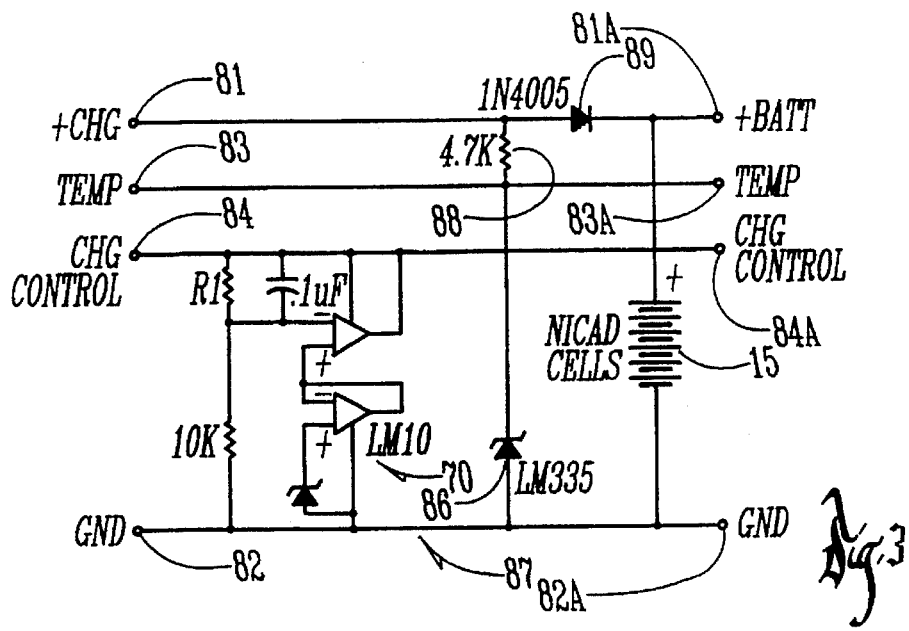
FIG. 3 is a circuit diagram illustrating a battery pack arrangement providing for the automatic identification of various types of batteries which may be associated with a fast charging system according to FIGS. 1, 2A and 2B.

Following determination of the presence of a battery pack 25 in the charger, the pack type must be identified as represented at 34 and 35 to allow for cells with different charge characteristics. In the case of an invalid reading of battery pack identity, the program may branch to an error sub-routine as indicated at 35A. The identification of the type of battery inserted into the charger is a significant step in the battery processing operation since battery cells of specialized types may offer significantly higher capacity than ordinary NiCad cells, but they may require charging at lower maximum rates. Other cells may allow high charging rates at extreme temperatures. Future technology developments may offer new cell types with unusual charging parameters that may be accommodated by applying an appropriate charging algorithm. Referring to FIG. 3, a proposed method for identification of the battery pack type is to connect a shunt voltage regulator 70 as part of a battery pack 87, as shown in FIG. 3. The shunt regulator may be comprised of a simple zener diode of a selected voltage value or it may be implemented with an active regulator e.g. as indicated at 70 in FIG. 3, depending on the number of different battery pack types that must be identified. Upon determination of the battery pack type, a suitable one of a set of parameter tables may be selected that contains the appropriate values for charging the specified cell type, as shown at 36, FIG. 2A.

Figure 4:
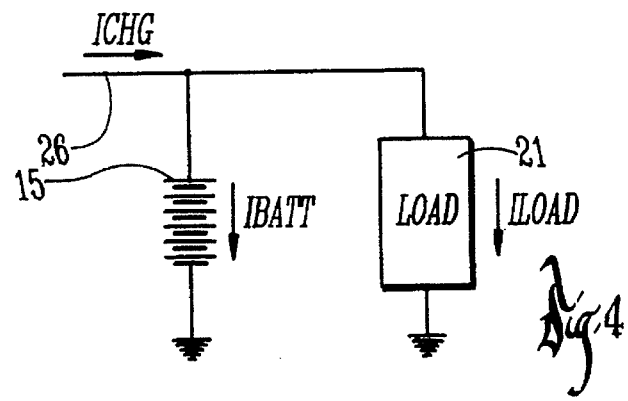
FIG. 4 is a diagram useful in explaining certain steps of the flow diagram of FIGS. 2A and 2B.

As indicated in FIG. 1, there may be a load 21 placed on the battery that requires current. Consequently, current supplied by a charger is shared by the load and the battery as shown in FIG. 4. If the load current Iload is larger than the charge current Ichg, the battery will provide the difference, resulting in further discharge of the battery rather than charging. To compensate for this effect, the control system senses the terminal voltage (Vb) of the battery (step 37, FIG. 2A) corresponding to pack voltage PV, FIG. 1, and applies increasing charge current to the battery in small increments (step 38) until the terminal voltage trend is positive (steps 39 to 41) meaning the battery is accepting charge rather than providing current to a load (see block FIG. 2A).

While the absolute terminal voltage of a NfCad battery is a poor indicator of its condition, its trend is a good indicator of charging versus discharging if it is measured over a short enough time that the pack temperature remains relatively constant. Once the battery voltage trend is determined to be positive, the level of current required by the load (Iterm of block 42 corresponding to Iload, FIG. 4) is known, and may be added to the desired net battery current level (Ibatt, FIG. 4) to select the actual charge current (Ichg, FIG. 4).

Typical NiCad cell specifications call for charging in a temperature range of 0° to 40° C. Many of the products that utilize NiCad batteries may operate in environments with temperatures that range from $-30°$ C. to 60° C. Consequently, it is possible that a battery pack may be placed in a charger immediately after being removed from either of these temperature extremes. If the pack temperature is greater than 40° C. (see decision step 43, FIG. 2A), the pack must be "cooled" to no more than 40° C. before charging may proceed. This is accomplished (as shown by step 44, FIG. 2A) by applying a charge current Ichg that equals the terminal load Iterm so that no net charge current is received by the battery and it may be cooled by the ambient environment. If the battery pack is cold, it must be warmed to a temperature above 0° C. This is carried out by steps 45 to 49, FIG. 2B. By applying a safe (low) charge current per the charge table of steps 47 and 49 (and FIG. 6), the pack may be warmed by the ambient environment of the charger.

Figure 8:
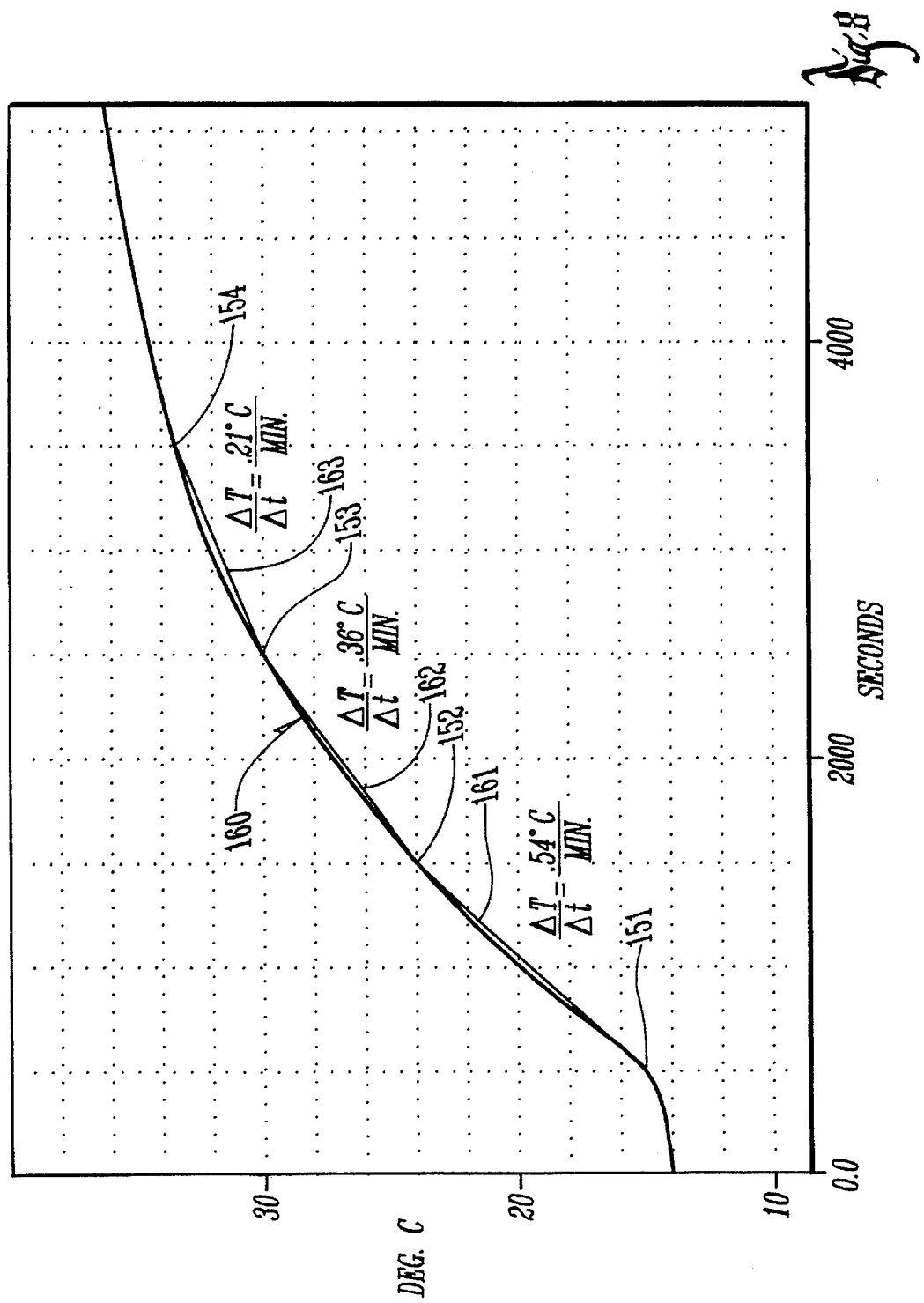
FIG. 8 shows a plot of measured battery pack temperature as a function of time for a previously fully charged enclosed battery pack where an overcharge current (Ichg) of three hundred milliamperes is applied and the ambient temperature $T_A$ is about fourteen degrees celsius (14° C.) and also illustrates successive approximate slope values for selected successive time intervals.

Although charging may begin when the battery temperature exceeds 0° C. according to the battery charging specifications, additional information is needed to determine the state of charge of the battery. The clearest method to determine whether a battery is fully charged is to detect the presence of the overcharge condition. In overcharge, the oxygen recombination reaction is highly exothermic which results in rapid heating of the battery. By applying twice the permissible substained overcharge rate as at steps 50 to 53, FIG. 2B, and monitoring cell temperature, it is possible to reliably determine that the overcharge condition has been reached. Unfortunately, when a cold pack is placed in a warm environment, there is a resultant temperature rise due to ambient warming that can actually occur at a rate faster than the heating due to the supply of a high value of overcharge current. Consequently, a reliable means of detecting heating due to overcharge current is to first insure that the battery temperature is not substantially less than the ambient temperature (as determined by step 48, FIG. 2B). Once the battery is warmed to ambient temperature, the overcharge condition can be quickly detected by means of steps 50 to 53 since any further substantial increase in temperature can be attributed to internal heat being evolved by the battery. If the pack has been in a hot environment, the cooling (steps 43 and 44, FIG. 2A) will bring its temperature down to no more than 40° C., which is above the ambient temperature of the charger. Overcharge induced heating will cause the pack temperature to begin to increase again as shown by FIG. 8. According to the described control method, the charge current applied to the battery for overcharge detection (step 50, FIG. 2B) is double the standard overcharge table value of steps 47, 49 and 58 (and of FIG. 6) to improve the ability to detect a temperature increase. Since the test time is relatively short, little gas pressure increase and potential for cell venting is involved.

Once it has been determined that the battery is not in the overcharge condition (at decision block 53, FIG. 2B), it is a relatively simple matter to apply the appropriate charge value from the fast charge parameter table (as at step 54, FIG. 2B). The fast charge table value may correspond to that indicated in FIG. 7 and is a function of temperature so that a temperature regulation capability is implemented for reducing the current applied at elevated temperatures. During the fast charge operation, battery temperature increase is closely monitored (steps 55 to 57) to determine when overcharge has been reached, so that the fast charge cycle may be terminated (as represented by branch line 57A) and a controlled temperature overcharge cycle may be initiated as represented by step 58, FIG. 2B, and FIG. 6 to "top-off" the battery for maximum capacity. After the overcharge cycle is complete (after step 59), a trickle charge current is applied per step 60 to maintain the full battery capacity and offset the effects of self-discharge normally seen when a battery rests in an idle condition.

Figure 5:
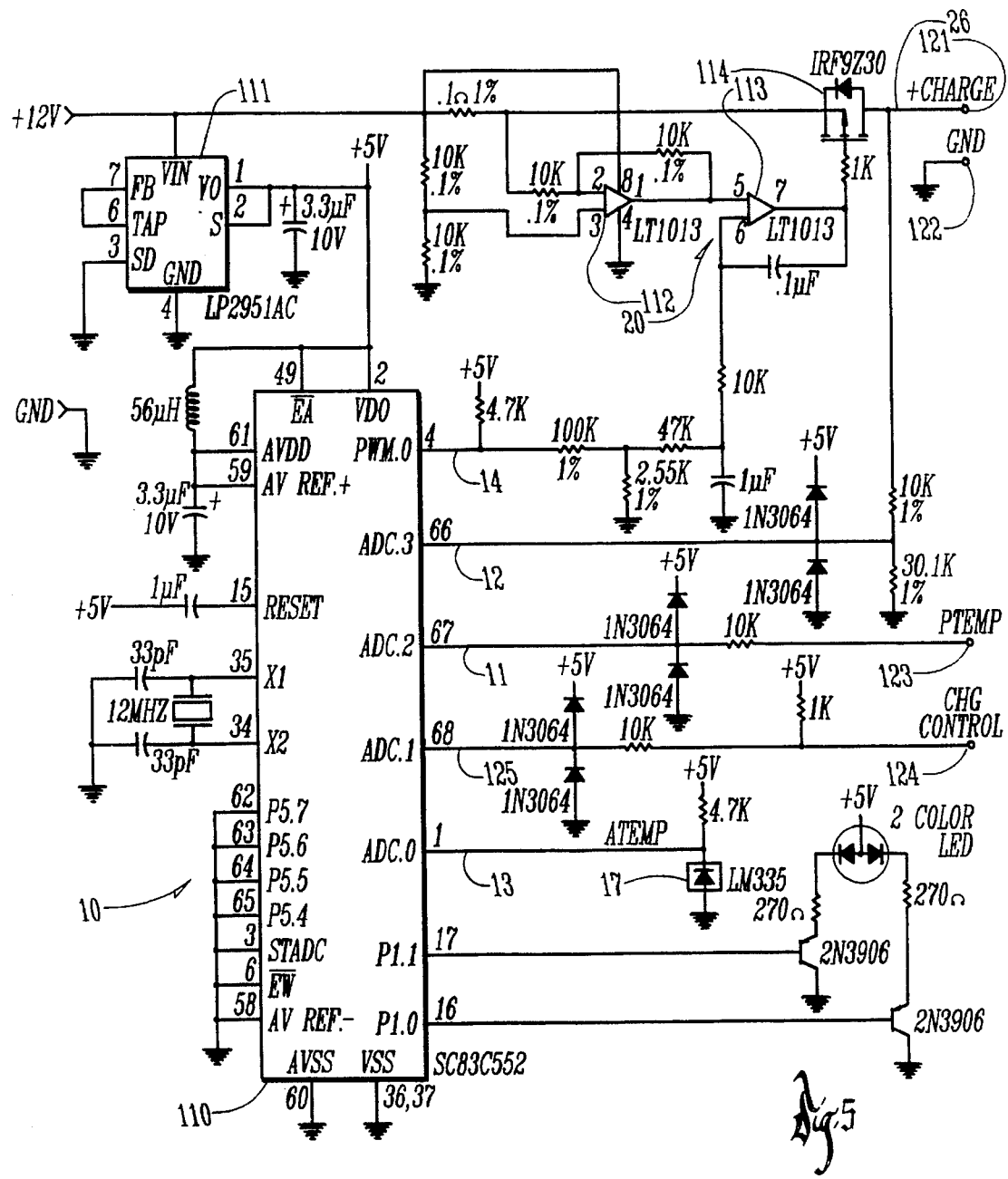
FIG. 5 is a circuit diagram for illustrating an exemplary implementation of the block diagram of FIG. 1.

FIG. 5 shows an exemplary embodiment of the described fast charging system utilizing a microprocessor system with a programmed control system for fast charging of battery packs. Other embodiments involving control circuits contained within a data terminal or other utilization device may employ identical control methods without departing from the concepts described.

Since FIG. 5 represents an implementation of FIG. 1, reference numerals increased by one hundred have been applied in FIG. 5 so as to facilitate correlation therewith. The major components of FIG. 5 may comprise commercially available parts which are identified as follows:

microprocessor chip 110 of microprocessor system 10, type SC83C552 voltage regulator 111, type LP2951AC amplifiers 12 and 13 of charge regulator 20, type LT1013, transistor 114, type 1RF9z30 temperature sensor 17, type LM335

The programming for microprocessor element 110 of FIG. 5 may correspond with that represented in FIGS. 2A, 2B, 6 and 7, as described with reference to these figures and the circuits of FIGS. 1, 3 and 4. By way of example, terminals 121, 122, 123 and 124, FIG. 5, may be connected with terminals 81, 82, 83 and 84 respectively in FIG. 3. Temperature sensor 86, FIG. 3, which is connected between terminals 82 and 83, may correspond with sensor 16 and may be mounted in intimate heat transfer relation with battery 15 and within the housing of the battery pack 25 as represented in FIG. 1. Resistor R1, FIG. 3, has a respective one of a set of values so as to provide a voltage level between terminals 82 and 84 selected so as to identify the particular type of battery pack 87 with which it is associated.

Terminals 81A, 82A, 83A and 84A may be connected with a utilization circuit to supply energy thereto during portable operation. It will be noted that the battery pack 87 can be associated with the circuitry of the sixteen figure (16A and 16B) of incorporated U.S. Pat. No. 4,709,202, terminals 81A and 82A having a quick-release connection with terminals JP-1, JP-2, of U.S. Pat. No. 4,709,202 and terminals 83A having a quick-release coupling with terminal J7-3, of U.S. Pat. No. 4,709,202. Terminal 84A can be used by the portable device to identify the battery pack, where the portable device provides a circuit such as associated with terminal 124, FIG. 5, leading to an analog to digital input such as 125, FIG. 32.

FIG. 8 illustrates by a plot 160 the increase in temperature as a function of time of an enclosed battery pack such as FIG. 1 or 87, FIG. 3, due to an overcharge current of 300 milliamperes, where the battery means 15 is initially fully charged and is at a battery temperature of about minus eight degrees celsius, the ambient temperature being about fourteen degrees celsius. The slopes between successive points 151 to 154 are represented by straight line segments 161, 162 and 163, with respective slope values of 0.54 degrees celsius per minute, 0.36 degrees celsius per minute and 0.21 degrees celsius per minute.

Figure 9:
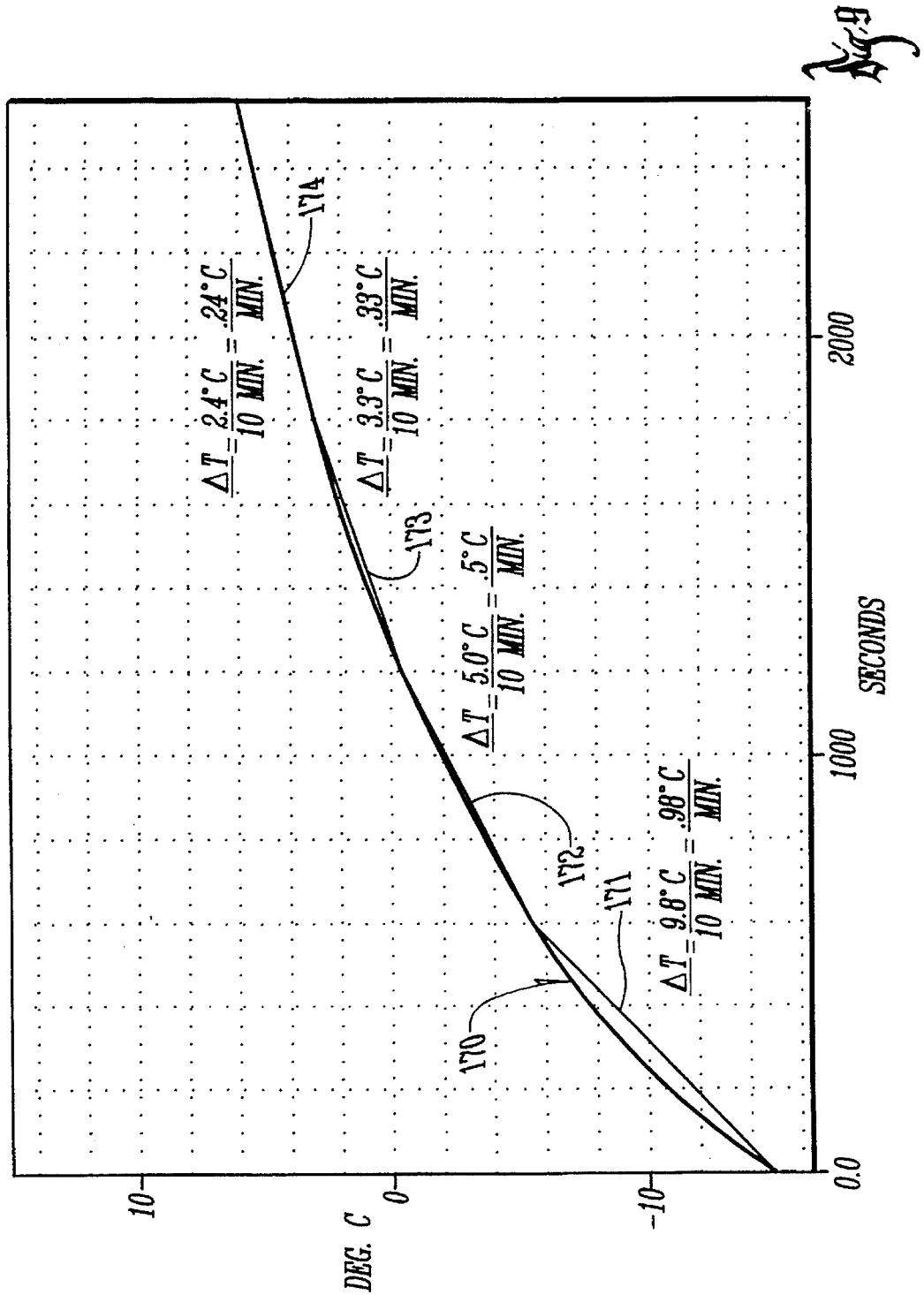
FIG. 9 is a plot of measured battery pack temperature as a function of time for the case of an enclosed battery pack which is initially at a much lower temperature than ambient temperature; specifically the battery pack was initially at a temperature of about minus fifteen degrees celsius (−15° C.) while the ambient temperature was about twenty degrees celsius (20° C.), the battery pack receiving only a small charging current of six milliamperes.

FIG. 9 for the sake of comparison shows by a curve 170 the rate of warming of such a battery pack due to an ambient temperature which is substantially higher than battery temperature. Specifically FIG. 9 shows the case where initial battery temperature is about minus fifteen degrees celsius and ambient temperature is about twenty degrees celsius. Straight line segments 171 to 174 show approximate slope values of 0.98 degrees celsius per minute, 0.5 degrees celsius per minute, 0.33 degrees celsius per minute and 0.24 degrees celsius per minute. The relatively high slope values indicate that the differential between a high ambient temperature and a low battery temperature must be taken into account when using steps 50 to 53, FIG. 28, to determine whether a battery is in the overcharge range.

DISCUSSION OF FIGS. 6 THROUGH 9 AND TABLES I AND II

Figure 6:
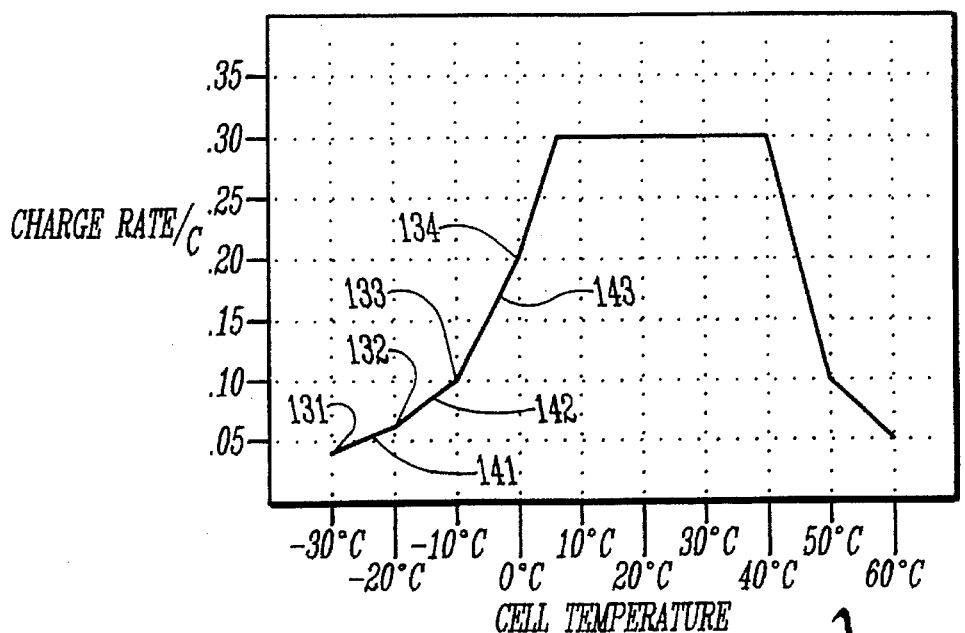
FIG. 6 shows a plot depicting a maximum permissible overcharge rate for fast charge cells as a function of cell temperature, and provides information which may be incorporated in the programming for the system of FIGS. 1 through 5 for establishing an optimum value of charging current (Ichg) during sustained overcharging.
Figure 7:
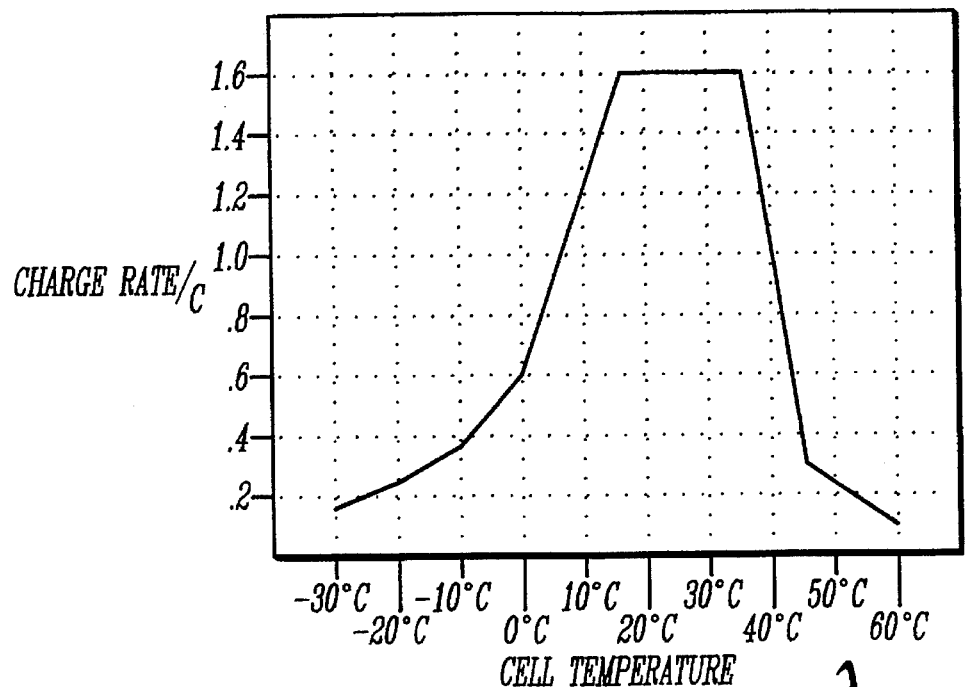
FIG. 7 is a plot of maximum charge rate for fast charge cells as a function of cell temperature showing exemplary data which may be used for the system programming in FIGS. 1 through 5 for establishing an optimum value of charging current for a battery which has not yet reached the overcharge state.

FIGS. 6 and 7 represent in effect a series of tables of charge rate versus temperature since the ordinate values are in units of charge rate (e.g. current Ibatt in milliamperes divided by capacity C in milliampere-hours). The following TABLES I and II give values of overcharge and fast charge corresponding to FIGS. 6 and 7 for successive temperatures in increments of two degrees celsius, and give corresponding current values in milliamperes for two different values of battery capacity C, namely C equals 800 milliampere-hours and C equals 1200 milliampere hours.

TABLE I

Charge Table: Overcharge and Fast Charge
Battery type: 800 ma-hr fast charge

| Temp, °C. | Overcharge value | | Fast Charge value | |
| --- | --- | --- | --- | --- |
| | C. units | ma. | C. units | ma. |
| −30 | 0.040 | 32 | 0.160 | 128 |
| −28 | 0.044 | 35 | 0.176 | 141 |
| −26 | 0.048 | 38 | 0.192 | 154 |
| −24 | 0.052 | 42 | 0.208 | 166 |
| −22 | 0.056 | 45 | 0.224 | 179 |
| −20 | 0.060 | 48 | 0.240 | 192 |
| −18 | 0.068 | 54 | 0.264 | 211 |
| −16 | 0.076 | 61 | 0.288 | 230 |
| −14 | 0.084 | 67 | 0.312 | 250 |
| −12 | 0.092 | 74 | 0.336 | 269 |
| −10 | 0.100 | 80 | 0.360 | 288 |
| −8 | 0.120 | 96 | 0.408 | 326 |
| −6 | 0.140 | 112 | 0.456 | 365 |
| −4 | 0.160 | 128 | 0.504 | 403 |
| −2 | 0.180 | 144 | 0.552 | 442 |
| 0 | 0.200 | 160 | 0.600 | 480 |
| 2 | 0.220 | 176 | 0.742 | 594 |
| 4 | 0.240 | 192 | 0.886 | 709 |
| 6 | 0.260 | 208 | 1.029 | 823 |
| 8 | 0.280 | 224 | 1.171 | 937 |
| 10 | 0.300 | 240 | 1.314 | 1051 |
| 12 | 0.300 | 240 | 1.457 | 1166 |
| 14 | 0.300 | 240 | 1.600 | 1280 |
| 16 | 0.300 | 240 | 1.600 | 1280 |
| 18 | 0.300 | 240 | 1.600 | 1280 |
| 20 | 0.300 | 240 | 1.600 | 1280 |
| 22 | 0.300 | 240 | 1.600 | 1280 |
| 24 | 0.300 | 240 | 1.600 | 1280 |
| 26 | 0.300 | 240 | 1.600 | 1280 |
| 28 | 0.300 | 240 | 1.600 | 1280 |

TABLE I-continued

Charge Table: Overcharge and Fast Charge
Battery type: 800 ma-hr fast charge

| Temp, °C. | Overcharge value | | Fast Charge value | |
|---|---|---|---|---|
| | C. units | ma. | C. units | ma. |
| 30 | 0.300 | 240 | 1.600 | 1280 |
| 32 | 0.300 | 240 | 1.600 | 1280 |
| 34 | 0.300 | 240 | 1.600 | 1280 |
| 36 | 0.300 | 240 | 1.340 | 1072 |
| 38 | 0.300 | 240 | 1.080 | 864 |
| 40 | 0.300 | 240 | 0.820 | 656 |
| 42 | 0.260 | 208 | 0.560 | 448 |
| 44 | 0.220 | 176 | 0.300 | 240 |
| 46 | 0.180 | 144 | 0.275 | 220 |
| 48 | 0.140 | 112 | 0.250 | 200 |
| 50 | 0.100 | 80 | 0.225 | 180 |
| 52 | 0.090 | 72 | 0.200 | 160 |
| 54 | 0.080 | 64 | 0.175 | 140 |
| 56 | 0.070 | 56 | 0.150 | 120 |
| 58 | 0.060 | 48 | 0.125 | 100 |
| 60 | 0.050 | 40 | 0.100 | 80 |

TABLE II

Charge Table: Overcharge and Fast Charge
Battery type: 1200 ma-hr fast charge

| Temp, °C. | Overcharge value | | Fast Charge value | |
|---|---|---|---|---|
| | C. units | ma. | C. units | ma. |
| −30 | 0.040 | 48 | 0.160 | 192 |
| −28 | 0.044 | 53 | 0.176 | 211 |
| −26 | 0.048 | 58 | 0.192 | 230 |
| −24 | 0.052 | 62 | 0.208 | 250 |
| −22 | 0.056 | 67 | 0.224 | 269 |
| −20 | 0.060 | 72 | 0.240 | 288 |
| −18 | 0.068 | 82 | 0.264 | 317 |
| −16 | 0.076 | 91 | 0.288 | 346 |
| −14 | 0.084 | 101 | 0.312 | 374 |
| −12 | 0.092 | 110 | 0.336 | 403 |
| −10 | 0.100 | 120 | 0.360 | 432 |
| −8 | 0.120 | 144 | 0.408 | 490 |
| −6 | 0.140 | 168 | 0.456 | 547 |
| −4 | 0.160 | 192 | 0.504 | 605 |
| −2 | 0.180 | 216 | 0.552 | 662 |
| 0 | 0.200 | 240 | 0.600 | 720 |
| 2 | 0.220 | 264 | 0.742 | 890 |
| 4 | 0.240 | 288 | 0.886 | 1063 |
| 6 | 0.160 | 312 | 1.029 | 1280 |
| 8 | 0.280 | 336 | 1.171 | 1280* |
| 10 | 0.300 | 360 | 1.314 | 1280* |
| 12 | 0.300 | 360 | 1.457 | 1280* |
| 14 | 0.300 | 360 | 1.600 | 1280* |
| 16 | 0.300 | 360 | 1.600 | 1280* |
| 18 | 0.300 | 360 | 1.600 | 1280* |
| 20 | 0.300 | 360 | 1.600 | 1280* |
| 22 | 0.300 | 360 | 1.600 | 1280* |
| 24 | 0.300 | 360 | 1.600 | 1280* |
| 26 | 0.300 | 360 | 1.600 | 1280* |
| 28 | 0.300 | 360 | 1.600 | 1280* |
| 30 | 0.300 | 360 | 1.600 | 1280* |
| 32 | 0.300 | 360 | 1.600 | 1280* |
| 34 | 0.300 | 360 | 1.600 | 1280* |
| 36 | 0.300 | 360 | 1.340 | 1280* |
| 38 | 0.300 | 360 | 1.080 | 1280* |
| 40 | 0.300 | 360 | 0.820 | 984 |
| 42 | 0.260 | 312 | 0.560 | 672 |
| 44 | 0.220 | 264 | 0.300 | 360 |
| 46 | 0.180 | 216 | 0.275 | 330 |
| 48 | 0.140 | 168 | 0.250 | 300 |
| 50 | 0.100 | 120 | 0.225 | 270 |
| 52 | 0.090 | 108 | 0.200 | 240 |
| 54 | 0.080 | 96 | 0.175 | 210 |
| 56 | 0.070 | 84 | 0.150 | 180 |
| 58 | 0.060 | 72 | 0.125 | 150 |
| 60 | 0.050 | 60 | 0.100 | 120 |

*note: maximum charge current available is 1280 ma.

TABLES I and II may be stored in machine readable form in the memory of microprocessor system 10, FIG. 1, or 110, FIG. 5, e.g. in first and second read only memory segments. Thus if step 34, FIG. 2A, identified an 800 milliampere-hour capacity fast charge nickel-cadmium battery means, the microprocessor would access the first memory segment corresponding to TABLE I for steps in FIG. 2B such as 47, 49, 50, 54 and 58, while if step 34, FIG. 2A showed a 1200 milliampere-hour capacity fast charge nickel-cadmium battery means the second memory segment corresponding to TABLE II would be addressed.

If for example, the battery temperature (Ptemp) in step 46, FIG. 2B, were greater than nineteen degrees celsius but less than or equal to twenty-one degrees celsius, the overcharge value read from memory segment I would be 240 milliamperes (0.300 units in FIG. 6 times 800 milliampere-hours, the battery capacity C, equals 240 milliamperes). Thus according to step 47, FIG. 2B, and step 49, an overcharge current of 240 milliamperes (plus any needed load current) would be supplied by regulator 20 until temperature sensor 16 showed that battery temperature exceeded ambient temperature (Atemp, 13, FIG. 1).

If ambient temperature were thirty degrees celsius and the battery temperature were in the range from thirty-one to thirty-three degrees celsius, a current of 480 amperes would be applied according to step 50, FIG. 2B, but for a limited duration (e.g. about ten minutes per step 51) such as to avoid substantial detriment to the useful life of the battery means.

FIG. 9 illustrates warming of the battery pack as a function of time with the battery pack initially at a temperature of about minus fifteen degrees celsius. From FIG. 6, it can be seen that maximum permissible overcharge current corresponds to about 0.08 units. For a battery capacity of 800 milliampere hours, this would correspond to an overcharge current value of greater than sixty milliamperes, while FIG. 9 shows the warming rate with an ambient temperature of about twenty degrees celsius and a relatively negligible value of charging current (i.e. Ichg equals six milliamperes). It will be noted that the warming rate in FIG. 9 in the first 600 seconds is 0.98 degrees celsius per minute which considerably exceeds the warming rate produced by a current of 300 milliamperes in FIG. 8.

SUPPLEMENTARY DISCUSSION OF FIGS. 1 THROUGH 9

For representing an embodiment such as that of FIG. 3, a microprocessor system such as indicated at 10 in FIG. 1 would be shown with a fourth input to A/D means 10A corresponding with input 1250 FIG. 5. For such an embodiment each type of battery means such as the one with 800 milliampere-hour capacity and temperature characteristics as shown in Table I, and the one with 1200 ampere-hour capacity and characteristics according to Table II would have a respective distinct value of R1, FIG. 3, and a respective different shunt voltage level so as to enable the microprocessor system 10 to reliably identify each of numerous types of battery means pursuant to step 34, FIG. 2A. The microprocessor system 10, FIG. 1 or 110, FIG. 5, may store a set of parameter tables such as Tables I and II in machine readable form with each table of such set having an address associated with the corresponding shunt voltage level. In this way the appropriate stored table can be interrogated by the microprocessor in accordance with a given battery temperature reading so as to obtain appropriate current values for steps 38, 47, 49, 50, 54 and 58, FIGS. 2A and 2B.

The battery identification means such as 110, FIG. 30, would distinguish the presence or absence of an internal current regulator as well as identifying the various battery types requiring different charging and overcharge treatment.

Other stored machine readable tables of computer system 10 or 110 may include acceptable maximum overcharge rates as represented in the sixth figure of incorporated U.S. Pat. No. 4,455,523 and have charge rates, e.g., as described at Col. 9, line 26 to Col. 10, line 32 of the incorporated U.S. Pat. No. 4,455,523. Such stored tables would insure that the charging system of FIG. 1 or FIG. 5 would be compatible with a battery means such as shown in U.S. Pat. No. 4,455,523. For example, the stored table for the battery means of 4,455,523 (FIGS. 9A, 9B) could take account of internal heating within the internal regulator (173, FIG. 9A) of the battery pack and insure that the current to the battery (20, FIG. 9A of U.S. Pat. No. 4,455,523) and to the battery load did not exceed the power dissipation capacity of the internal regulator network (173, FIG. 9A).

The current regulator 20 of present FIG. 1 may be controlled to provide a voltage VCHG at the line CHG in 4,455,523 (FIG. 9A) of approximately seven volts which would result in minimum power dissipation in the interior regulator network (173, FIG. 9A of U.S. Pat. No. 4,455,523). The presence of an internal current regulator within a hand-held terminal unit is also indicated in incorporated U.S. Pat. No. 4,885,523 (at 26–28, FIG. 26). The associated charging current control circuit (26–22 of U.S. Pat. No. 4,885,523) could conform with the embodiments of FIGS. 1 to 9 in the selection of charging and overcharge current values while tending toward minimum power dissipation in the internal regulator network (such as 173, FIG. 9A of U.S. Pat. No. 4,455,523 or such as indicated at 26–28 of U.S. Pat. No. 4,885,523).

In a different embodiment, each battery pack could have an internal digitally stored identification code digitally stored in the battery pack and accessible to an external microprocessor system such as 10 or 110 as in the embodiment of 4,885,523 (e.g. FIG.23 via contacts 23–51A; FIG. 25, via data output 25–51; FIG. 26 via components 26–36, 26–37, 26–20 and 26–23; or FIG. 27 via D to A component 27–37 or LAN interface 27–39).

Instead of bringing battery temperature up to ambient temperature as in steps 45 to 49, FIG. 2B, it would be conceivable to establish ambient temperature to match battery temperature, and then proceed with a test for overcharge condition as in steps 50 to 53, FIB. 2B. Similarly before steps 54 to 77, where the battery is initially at a low temperature, it would be conceivable to control ambient temperature so as to bring battery temperature up to zero degrees celsius or six degrees celsius by control of ambient temperature alone, or in combination with a suitable charging current. In this way, a relatively high charge rate according to FIG. 7 would be suitable, e.g., at least 0.6 C., and a maximum overcharge rate according to FIG. 6 would quickly be appropriate for the overcharge cycle of steps 58 and 59.

The stored charge rate information can take the form of end points such as 131, 132; 132, 133; 133, 134, FIG,. 6, for successive substantial straight segments such as 141, 142 and 149 , so that the microprocessor could interpolate a precise charge rate multiplier for any measured battery temperature. Thus, if segment 142 had end points at –20° C., 0.060 units and at –10°, 0.100, a battery temperature of –19° might be computed to correspond to 0.064 by linear interpolation. Of course, the points given in Tables I and II could be similarly interpolated to obtain intervening more precise overcharge and fast charge values.

With respect to steps 37 to 42, FIG. 2A, an internal microprocessor such as in 4,885,523 (FIG., 5 or FIGS. 9A, 9B) may determine battery load current and communicate the same to an external microprocessor such as 10 as shown in 4,885,523 (FIGS. 23, 25, 26 or 27, for example). FIG. 1 may represent the association of a non-portable battery conditioning station including components 10, 17 and 20 with a hand-held terminal unit containing a quickly removable battery pack 25 comprised of a nickel-cadmium rechargeable battery 15 and a battery temperature sensor 28 within housing 22. The hand-held terminal unit may provide load means 21, which may comprise a dynamic random access memory and other circuitry which is to be continuously energized during a charging operation.

As in the embodiment of FIG. 3, the handheld terminal units which are to be associated with components 10, 17 and 20 may include coupling means such as 81, 81A, 82, 83 and 84 which are automatically engaged with cooperating coupling means of the charging station when the hand-held unit is bodily inserted into a receptacle of the charging station. The coupling means 81 and 81A in FIG. 3 would be represented in FIG. 1 by a line (+ BATT) from component 20 corresponding to line 26, and a further line (+ CHG) leading to a network (representing components 68 and 69, FIG. 3) in turn connected with battery 15 and line 11.

An exemplary charging station adaptable for a hand-held unit including battery pack 87 of FIG. 3 is shown in greater detail in 4,885,523 (FIG. 27).

Where FIGS. 1 to 9 are applied to a system as represented in 4,885,523 (FIG. 27), components 10, 17 and 20 would be part of charger station (27–22). Line 26 would lead to a charging station contact engageable with external battery pack contact (27–11). Input line 12 would be connected via a further set of mating contacts with internal battery pack contact (27–61). Input line 11 would connect with contact (27–17). Alternatively, the charger station (27–22) would have a LAN interface (corresponding to 27–39) and would receive digital information as to battery terminal voltage (for example via amplifier 27–35A, an A to D converter of terminal 27–10A, LAN interface 27–39 and LAN data coupling means 27–19, 27–21). The charging station would then charge the battery packs (such as 27–10B) of terminals (such as 27–10A) in accordance with the embodiments of FIGS. 1 to 9. In place of the amplifier (27–37, representing components 26–36, 26–37), an identifying shunt voltage regulator 70, FIG. 3, would be part of each battery pack (27–10B).

As a further embodiment, the charger station of 4,885,523 (27–22) could comprise the components of FIG. 5, the line 12 being coupled with a battery (such as 27—27) via mating terminals including 121 (and 27–11 and through forward biased diode 27-D1, for example). In this embodiment the terminal (27–13) would mate with terminal 124, and the battery pack (27–10B) would conform with battery pack 87, FIG. 3 for example by including a respective identifying shunt regulator 70, FIG. 3, and e.g., nickel-cadmium batteries with respective characteristics as shown by FIGS. 6 to 9 and Tables I and II.

Summary of operation of FIGS. 1 through 9

Operation of the specific exemplary embodiment as presented in FIGS. 2A and 2B may be summarized as follows.

As represented by steps 32 and 33, the presence of a battery pack 25, FIG. 1, or 87, FIG. 3, may be sensed by means of the input 11, FIG. 1 or FIG. 5, from battery pack temperature sensor 16, FIG. 1, or 86, FIG. 3. A non-zero voltage input level on line 11 may signal the presence of a battery pack 25 coupled with components 10 and 2. The physical connections may be analogous to those of incorporated U.S. Pat. No. 4,885,523 (FIG. 26), for example, an exemplary arrangement of terminals for a battery pack 87 being shown in FIG. 3.

Referring to FIG. 4, the load current may be automatically sensed by means of steps 37 to 41 since battery voltage as measured at 12, FIG. 1 or FIG. 5, will not increase until a current Ichg, FIG. 3, in excess of battery load current Iload is applied to line 26, FIG. 1.

Where the battery pack has a given upper temperature limit which must be observed to avoid detriment to battery life, the battery may be automatically allowed to cool to a suitable temperature (e.g. 40° C.) if it is introduced into the charger at an unacceptably high temperature. This is represented by steps 43 and 44 which may be automatically performed by microprocessor 10, FIG. 1, or 110, FIG. 5, according to battery temperature (Ptemp) as sensed at input 11, FIG. 1 or FIG. 5.

As explained in reference to FIG. 9 in order to detect the battery overcharge condition, the microprocessor 10 or 110 automatically performs steps 45 to 49, FIG. 2B, to assure that battery temperature as measured at input 11 is not substantially lower than ambient temperature as sensed at input 13. Once battery temperature is at least essentially equal to ambient temperature, steps 50 to 53 are effective to automatically determine whether the battery is to receive a fast charge according to steps 54 to 57, and e.g. FIG. 7, or whether the microprocessor 10 or 110 is to govern the supply of charging current at 26 according to steps 58 and 59 and e.g. FIG. 6.

Discussion of Terminology

From the foregoing, it will be understood that steps 50 to 53, FIG. 2B are effective where the battery system can be made to exhibit a temperature characteristic which rises as a function of overcharge current over a given time interval generally as illustrated in FIG. 8. Another example may be a nickel hydride type battery. To accomplish this the charging system may operate automatically as in steps 45 to 49, FIG. 2B, to insure that the battery means has a state such that its temperature will not increase at a substantial rate due to a higher ambient temperature (e.g. as in FIG. 9). In particular, the state of the battery means may be automatically assured to be such that it will exhibit a substantially greater increase in battery temperature in response to a given selected charge rate when the battery is in overcharge condition (i.e. has already been fully charged) than when it is not in such an overcharge (or fully charged) condition.

As represented by step 50, FIG. 2B, the current automatically applied to the battery means exceeds battery load current by a substantial overcharge magnitude, e.g. twice the overcharge value obtained from FIG. 6, but the application is of limited duration (e.g. ten minutes per step 50, FIG. 2B) such as to avoid substantial detriment to the useful life of the battery.

According to steps 52 and 53, the microprocessor system automatically determines whether any increase in battery temperature due to step 50 is of a magnitude (e.g. two degrees celsius or greater) which is distinctive of the overcharge (or fully charged) condition of the battery means.

From the foregoing TABLE I, it will be understood if battery temperature at step 52, FIG. 2B, has reached thirty degrees celsius, step 54 would result in an initial relatively high battery charging current (Ibatt, FIG. 4) of about 1280 milliamperes if the temperature increases at step 53 was not greater than two degrees celsius, while if the increase at step 53 were found to be greater than two degrees celsius, step 58 would result in supply of a relatively lower battery charging current of about 240 milliamperes.

Where the relatively high battery charging current is applied, battery temperature is measured at regular intervals (e.g. at about one minute intervals per step 55, FIG. 2B) to assure that such high charge rate is terminated sufficiently quickly after overcharge (or fully charged) condition is detected so as to avoid any substantial detriment to the useful life of the battery means. That is, this "dynamic charging" is characterized by a close monitoring for an over charge condition by sensing a relevant parameter or parameters at intervals which are sufficiently brief to detect a shift in battery temperature (one example is a two degree Celsius shift) within a predetermined period of the battery temperature's shift.

The overcharge relatively lower charge rate is terminated after an overcharge interval so as to insure optimum charging of the battery means without detriment to its useful life.

Of course the charge rate or overcharge rate may be readjusted higher or lower according to FIGS. 6 and 7 at any desired time intervals, e.g. at each step 54, FIG. 2B, in charging mode, and by inserting steps such as 55 and 56 between steps 58 and 59 so that overcharge current would be re-selected at suitable intervals such as one-minute intervals.

Control of the recharging current can be called dynamic, to describe its archive and continuous adjustment. For example, close monitoring for the overcharge condition for the battery can be accomplished by sensing a relevant parameter or parameters at close intervals, e.g. sufficient monitoring to essentially instantly detect a two degree Celsius temperature increase. The charging current can be incrementally adjusted based on such monitoring in a dynamic manner by such active, continuous adjustment. As a result, greater efficiency in the recharging process can be achieved.

Referring to the plots of maximum acceptable overcharge rate in FIG. 6, it will be observed that there is a minimum temperature for each battery type below which overcharge current is not applied by the microprocessor system 10 or 110. In 4,885,523 (FIG. 6), the lower temperature extreme is shown as about zero degrees Fahrenheit (about minus eighteen degrees celsius). At about zero degrees Fahrenheit, the low overcharge rate is less than about capacity divided by fifty. In FIG. 6, the low temperature extreme is about minus thirty degrees celsius where the overcharge current of about 0.04 units corresponds to an overcharge rate of about capacity divided by twenty-five.

Above the lower limit temperature, there is a range of temperatures where the upper overcharge rate exceeds the lower overcharge rate by a factor of at least about four. For example, in 4,885,523 FIG. 6, the acceptable overcharge rate at a relatively high temperature of about one hundred and ten degrees Fahrenheit is close to capacity divided by five (0.2 C.), while the acceptable overcharge rate at the low temperature extreme of about zero degrees Fahrenheit is about capacity divided by fifty (0.02 C.) a ratio of overcharge rates of ten to one. According to FIG. 6, the microprocessor system 10 or 110 may supply values of overcharge at about five degrees celsius of about 0.30 units (C/3.3) while at a low temperature extreme of about minus thirty degrees celsius, the acceptable overcharge rate to be supplied by the microprocessor system is about 0.04 units (C/25), a ratio of about seven to one. Between the temperature values of the temperature range of 4,885,523 (FIG. 6), the permissible overcharge rate progressively increases with successively higher temperature values such as zero degrees, fifteen degrees, thirty-five degrees, fifty-five degrees, seventy-five degrees and ninety-five degrees (Fahrenheit). Similarly in FIG. 6, between temperatures of minus thirty degrees celsius and about five degrees celsius, the permissible overcharge rate progressively increases for successively increasing temperature values (such as −20° C., −10° C., and 0° C.).

Referring to FIGS. 1, 3 and 4, it will be understood that the embodiments of FIGS. 1 to 9 avoid series resistance means of substantial ohmic value such as shown in 4,885, 523 (at 131, FIG. 9A, 18–26, FIG. 18, 24–30, FIG. 24, 25–26, FIG. 25), for sensing battery current. Instead charging current source 20, FIG. 1, may be automatically operated to supply desired current values in an open loop manner. An automatic sequence such as steps 37 to 41, FIG. 2A, may be used to measure load current if this would be a fluctuating and possibly significant amount for a given hand-held terminal unit and would not be reported to the charging station by the hand-held unit. As shown by FIGS. 1, 3 and 4, the battery 15 has external terminals e.g. as at 81A, 82A, FIG. 3, with external circuit means connecting such terminals with the battery, such external circuit means having essentially negligible ohmic resistance such that the battery means supplies load current to a load via the external terminals with minimized ohmic loss at the battery side of said external terminals.

Figure 10:
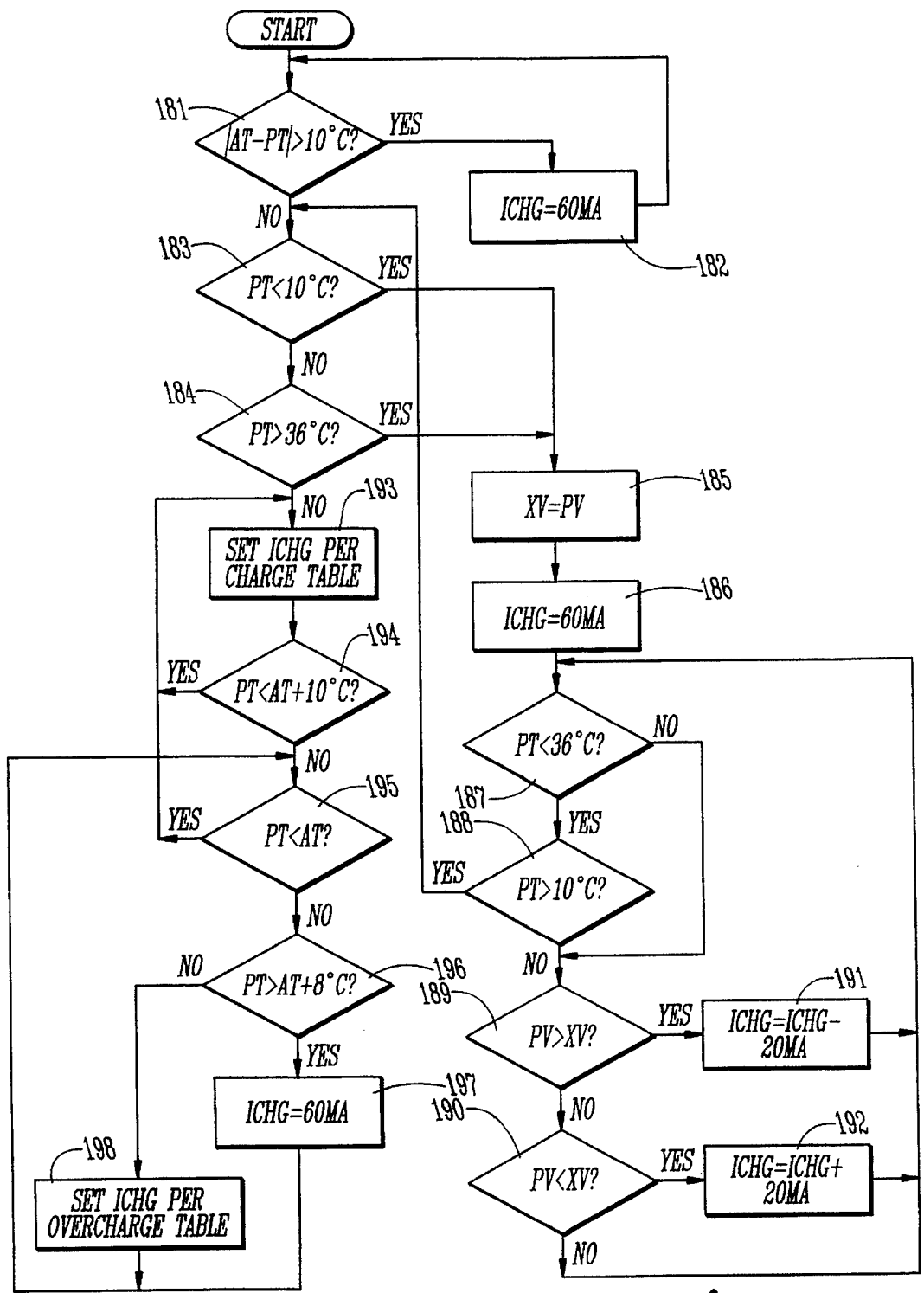
FIG. 10 shows an improved control procedure for carrying out fast charging and maintenance of a nickel-cadmium battery pack or a battery pack of similar overcharge characteristics, for example in conjunction with a microprocessor system as shown in FIG. 1.

Description of FIGS. 10, 11 and 12

As portable hand-held data and radio terminals continue to be used more widely in certain demanding applications, the need for fast charging of the terminal batteries becomes more significant. The increased use of high powered scanner attachments and peripherals as well as other connected devices often causes the terminal battery capacity to be taxed to the point where only a portion of the intended period of usage may be served with the stored charge available from a single battery pack. Consequently, it has become increasingly necessary to provide multiple packs which may be exchanged in such a way that a depleted pack may be replaced by a fresh one with minimal downtime. When a depleted pack is removed, it should be fully recharged in a least the amount of time that a fresh pack is able to operate the terminal. With a recharging capability of this type, it is then possible for virtually perpetual operation to be provided with as few as two battery packs per terminal.

A similar but further complicated application involves the utilization of the described data terminals on a vehicle such as an industrial forklift truck. In this type of application, the terminal may receive power for operation from the vehicle thP majority of the time. Often, however, it may be necessary for the terminal to be physically removed from the vehicle and operated in a fully portable mode for potentially extended periods of time. For this reason, it is highly advantageous to automatically quickly recharge the terminal batteries, and then to automatically maintain the terminal batteries substantially at their fully charged or "topped off" state while safeguarding the batteries against detriment to their optimum useful life.

The above stated objectives for a battery charging system have traditionally been extremely difficult to achieve. FIGS. 10, 11 and 12 show an embodiment that addresses both aspects of fast charging and maintenance in a novel and unique way.

As described with reference to FIGS. 1 through 9, the characteristics of the popular NiCad battery technology are such that the rates at which charging may be accomplished are a strong function of temperature and state of charge. If the cell is in a discharged condition, the rate at which charge may be applied is relatively high, regardless of the cell temperature. If the cell is in a charged condition, the rate at which charge may be applied to the cell is determined by the temperature of the cell. At the limits of cell temperature, excessive charge current may cause permanent damage resulting in premature failure of the cell. Consequently, for fast charging to be accomplished safely, the temperature and state of charge of a battery must be determined.

Battery temperature herein designated PT (for pack temperature) may be measured directly by the use of a pack temperature sensor 16 thermally coupled to the battery pack 25. State of charge of a NiCad battery type is more difficult to determine. In general, the most reliable indication that a NiCad battery is fully charged is the release of heat while under charge. This only occurs when the battery is in the overcharge condition in which most or all of the current supplied to the battery causes evolution of oxygen gas at the positive electrode. When oxygen chemically recombines with cadmium at the negative electrode, heat is released. No other condition of operation of a NiCad battery causes appreciable heat to be generated.

In general, the process of converting charge current to stored charge in a NiCad battery is a slightly endothermic chemical reaction, that is, heat is removed from the environment of the battery and the battery gets slightly cooler. Consequently, it is possible to apply quite high rates of charge to the battery if it is not in the overcharge condition. Once the overcharge condition is reached, the slightly endothermic charge reaction is overwhelmed by the highly exothermic overcharge/oxygen recombination reaction. The rate of applied charge must then be quickly reduced to prevent excessive heating and battery damage.

As described in reference to FIGS. 1 to 9, a microcomputer 10 with the ability to measure the temperature of a battery and control the applied charge to that battery may be employed to effect charging at the maximum safe (non-damaging) rate and may also terminate the charge function to prevent damage to the battery when it is fully charged. The present embodiment also employs a microcomputer to measure battery temperature and control applied charge as indicated in FIG. 1, however, the process that is used to determine the appropriate charge current is quite substantially different, and significantly modifies and improves the performance of the charging system.

A flow diagram of the control procedure that accomplishes the described charging characteristics is shown in FIG. 10. It should be noted that the charging method described may be applied to either a terminal or utilization device with the circuits as shown in FIG. 1 or to a standalone pack charger with one or more sets of the same circuit. In the case of the pack charger configuration, the block 21 labeled "load" would not be present. In the terminal configuration the operating power required by the terminal itself would represent a load that requires current to be delivered by the charge circuit or battery.

In FIG. 10, the initial decision block 181, |AT−PT|>10° C., provides two pieces of information based on the ambient temperature value, AT, from sensor 17, FIG. 1, and battery pack temperature PT. The first information (when the temperature difference is not greater than ten degrees celsius) is that the temperature sensors 16 and 17 are in at least approximately agreement (which provides confidence that they are functioning properly). If the temperature difference is relatively great, it is possible that the battery pack and the charger are at significantly different temperatures, in which case they need to stabilize to an acceptable level before further procedure steps may be taken. If this condition is detected, a constant current of sixty milliamperes (60 ma.) is selected as indicated at 182 to provide a safe low maintenance current that may minimize further discharge of the battery if it is already in a relatively depleted state.

If the initial temperature difference is not excessive, the absolute temperature of the battery pack is examined at steps 183 and 184. The temperature range allowed for charging is between 10° C. and 36° C. If the battery temperature is not within this range, the battery may be allowed to cool or warm as the case may be for the charging process to continue. It may be assumed (or specified) that the ambient temperature environment of the charger itself is between these limits, so that the battery temperature will stabilize after some time to an acceptable level. During this temperature stabilization time, it is preferable that no charge current be supplied to the battery, though it may be necessary for current to be supplied to a load, as in the case of a terminal which receives it operating power from the battery or charger while charging is in progress. Since the load current is generally not known, a mechanism may be provided to adjust the current provided by the charger to accurately match the load current of the terminal. The means by which this is accomplished is as follows:

1. Examine the battery pack terminal voltage designated PV as indicated at block 185.
2. Select an initial charge current of sixty milliamperes (60 ma.) as indicated at 186.
3. Examine the pack temperature PT at 187 and 188 to determine if it has stabilized within the desired limits. If so, return to the main charging process.
4. Examine the present terminal voltage PV at 189 and 190.
5. If the battery terminal voltage has increased, decrease the charge current by twenty milliamperes (20 ma.) as indicated at 191.
6. If the battery terminal voltage has decreased, increase the charge current by twenty milliamperes (20 ma.) as indicated at 192.
7. If no terminal voltage change is detected, leave the charge current unchanged and return to step No. 3 listed above (referring to entry into the flow diagram of FIG. 10 at 187 and 188).

This method serves to provide an adaptive current that will prevent the battery from being further depleted while its temperature stabilizes to an allowable level.

After the battery temperature has stabilized to an allowable level, it is then possible to begin charging at high rates of charge. As described with reference to FIGS. 1 to 9, a stored table containing values of charging currents that may be safely applied to a battery of a known capacity at a given temperature is used to determine the charge current, this being indicated at 193. While the table values for fast charge current will not cause stress or damage to a battery when it is discharged and efficiently receiving charge, in general, these charge currents are high enough to cause permanent damage to the battery if not terminated properly. The indication that the battery is nearing full charge is based on detection of the overcharge condition, which is the only condition of a NiCad cell that releases significant heat. In the flow diagram of FIG. 10, the condition for decision block 194, PT<AT+10° C., provides the test for overcharge detection. In essence, the test for overcharge is to detect that the battery is becoming warmer than the ambient environment, in this case by an amount of ten degrees celsius (10° C.). When this amount of heating is detected indicating that the battery has reached the overcharge condition to an appreciable degree, the fast charge function is terminated.

Upon completion of fast charge, a maintenance charge function is initiated which continues to monitor the battery temperature rise above the ambient environment (step 195) and maintains an applied overcharge current at a level that regulates that battery temperature rise. The overcharge temperature rise is held to eight degrees celsius (8° C.) as shown by steps 196, 197, and 198; this being a safe sustainable level that may be maintained indefinitely without appreciable cumulative damage to the battery. The temperature regulation process is implemented by selecting between a low charge current of sixty milliamperes (60 ma.) and the higher overcharge current table value depending on the measured temperature rise. By maintaining the battery in a state of continuous safe overcharge, it is possible to hold the battery in its maximum state of charge when it has been returned to the charger, thereby ensuring that the user has the full battery capacity available whenever needed. If the battery temperature falls below the ambient temperature as determined at step 195, the fast charge state will be re-entered and the maximum safe charge current will be applied for the measured temperature. It should be noted that this situation might occur if a very warm battery pack is placed in a pack charger at nominal temperature. Initially if the temperature difference is greater than 10° C. the pack will be charged at a fixed current of 60ma until the temperature difference is reduced. If the pack temperature is less than 36° C. at this time, its temperature difference may still be very close to 10° C. which might allow the process to advance to the final maintenance state of the charge system. As the pack cools further due to ambient cooling and the endothermic charging reaction, its temperature may go below the ambient temperature (step 195), at which point the fast charge state would be re-entered.

In the maintenance mode, the current required for operation of a terminal is provided by the fact that the charge current (step 197 or 198) will exceed the terminal operating current by an amount necessary to maintain the temperature rise of the battery. Consequently, this charging system provides broad flexibility for fast charging of NiCad batteries in utilization devices with widely varying current demands.

A useful feature of this charging method is that it is not critical that the charging voltage source be able to provide the maximum current specified by the controlling microcomputer for reliable charging to be accomplished. For example, if the selected value of charge current for a certain battery pack is 1500 ma., but the voltage source has a current capacity of only 600 ma., the fast charge state of the procedure would be maintained in exactly the same way except it would take correspondingly longer for the overcharge state to be reached. This feature of the charging method is particularly useful in configurations where multiple battery packs may be charged in a single unit and it is necessary to place constraints on the unit power supply for economic or size reasons. It is a relatively simple matter to externally limit the maximum delivered current so that the actual charge current is less than the value selected by the controlling microcomputer.

FIG. 11 shows a schematic diagram of a charge current regulator circuit which has the capability of delivering a constant current output to a battery in proportion to an input control voltage. In addition, this circuit has a maximum delivered current limit that may be set by a resistor selection in power supply constrained applications.

The CHARGE CONTROL input 210, FIG. 11, is intended to be driven by a digital to analog (D/A) converter output of a microcomputer based utilization device such as a data terminal. The CHARGE CONTROL input develops a control voltage at pin 3 of differential amplifier 11-U1. The output pin 1 of 11-U1 drives 11-Q3 which establishes a current through 11-R8 that develops a voltage at 11-UI, pin 4 equal to the voltage at 11-U1, pin 3. Since the current gain $h_{fe}$ of 11-Q3 is relatively high (about 200) the collector current of 11-Q3 is nearly equal to the emitter current, resulting in an equal current through both 11-R5 and 11-R8. Since these resistors are of equal magnitude, the input voltage at CHARGE CONTROL 210 appears across 11-R5 referenced to the +12 volt supply voltage. The amplifier at 11-U1A pins 8, 9 and 10 is a differential configuration operating in a negative feedback mode. With a voltage developed across 11-R5, the voltage at pin 9 of 11-U1A will be decreased, which increases the voltage at the output pin 8. This increased voltage drives current into 11-Q2 which increases the drive current to 11-Q1 establishing a current through current sense resistor 11-R6. When the voltage drop across 11-R6 equals the voltage across 11-R5, the amplifier output will stabilize, holding the output current constant. With a sense resistor value of one ohm at 11-R6, the voltage to current conversion factor is one ampere per volt (1 amp./volt). If the CHARGE CONTROL input is left unconnected, the 1.25 volt voltage reference 11-CR1 and resistors 11-R2 and 11-R4 establish an open circuit voltage of 0.120 volts which establishes a "default" output current of 120 ma. This condition may be useful in cases where a utilization device is either unintelligent or its battery is completely depleted in which case its processor is unable to operate and the battery must be brought up to at least minimal capacity for the processor to function.

The circuit block consisting of the amplifier at 11-U1B pins 5, 6 and 7 is a clamp circuit that limits the maximum voltage that may be applied to 11-U1, pin 3. By limiting the input voltage, the maximum available charge current may then be limited to some selected value dependent on the selection of 11-R15 and 11-R16. With values of twenty-one kilohms for 11-R15 and ten kilohms for 11-R16, a voltage of 0.40 volts is applied to the clamp circuit input. If the input voltage driven on CHARGE CONTROL is less than 0.40 volts, the output pin 7 of 11-U1B remains low which biases 11-Q4 off. If the CHARGE CONTROL input voltage reaches or exceeds 0.40 volts, 11-Q4 is turned on sufficiently to maintain a voltage of exactly 0.40 volts at 11-U1B pin 5 which prevents the input voltage to the control amplifier from exceeding this voltage. The voltage to current transfer function of the system is shown in FIG. 12. It should be noted that the clamp voltage and maximum available current may be modified by selecting different values for 11-R15 and 11-R16 or the voltage reference 11-CR1. A maximum available current of 1.25 amps may be implemented by deleting 11-R16 in which case the full reference voltage appears at the clamp circuit input.

The microprocessor system means 10, FIG. 1, or 110, FIG. 5, operates automatically to apply substantially maximum charging current to the battery means consistent with avoiding substantial detriment to the useful life of the battery means e.g. as represented in FIG. 7.

Discussion of Common Features in the Embodiments of FIGS. 2A, 2B and 10

A basic step of each embodiment is to compare battery temperature and ambient temperature as represented at 48, FIG. 2B and 181, FIG. 10. As indicated by FIG. 9, where ambient temperature is 20° C. (68° F.), the increase in battery temperature because of higher ambient temperature is relatively moderate for an initial battery temperature approaching 10° C. (50° F.). Thus, if battery temperature is at least 10° C. (step 183, FIG. 10), and if ambient temperature is within 10° C. of battery temperature (step 181), a substantial charging current may be supplied (step 73) even if the battery has not previously been checked for the overcharge condition (as in steps 50 to 53, FIG. 2B).

In each embodiment, charging current may be applied according to a fast charge characteristic such as shown in FIG. 7.

For step 193, FIG. 10, it has already been ascertained that battery temperature is between 10° C. and 36° C., a region of the overcharge characteristic of FIG. 6 which is least sensitive to charging current. Further, in each embodiment current is applied for only a limited time interval, e.g. one minute or less (see step 55, FIG. 2B) before battery temperature is read again for the purpose of detecting a change of battery temperature indicative of the overcharge condition.

For step 57, FIG. 2B, an increase in battery temperature of two degrees celsius or greater is taken as an indication of the overcharge condition.

For steps 194 to 196, the battery temperature is initially less than 10° C. greater than ambient temperature (step 181), so that if battery temperature increases so as to be equal or greater than the sum of ambient temperature and 10° C., this can be taken as indicating the overcharge condition. The comparison to ambient temperature plus 10° C. at step 194 can take place frequently, e.g. at one minute intervals where steps 193 and 194 are repeated cyclically.

Step 197, FIG. 10, can be taken as setting a current value corresponding to 0.2 C. (C. equals 1200 milliampere-hours) which according to Table II would be suitable for temperatures between about −25° C. and 60° C. Since ambient temperature is assumed to be maintained between 10° C. and 36° C., a low value of sixty milliamperes would be suitable for Table I also, even assuming no current being taken by load 21, FIG. 1.

In each embodiment, measurement of battery terminal voltage is utilized to obtain a measure of load current. In FIGS. 2A, 2B, this is accomplished by increasing current in steps of say ten milliamperes (at 38, FIG. 2A) and sensing when battery voltage increases (step 41).

In FIG. 10, an initial current value of sixty milliamperes (step 186) is increased or decreased as measured battery voltage fluctuates in comparison to a reference value (XV, step 185). Thus, the current supplied is roughly equal to the required load current until such time as battery temperature increases above 10° C.

Discussion of the Embodiment of FIG. 10

Steps 31 to 42, FIG. 2A, are not inconsistent with the processing steps of FIG. 10, and could be used therein to identify a given battery pack, and/or to determine terminal load current during charging.

Steps 37 to 38, FIG. 2A, could be substituted for step 34 if desired.

Also, step 44 could be used in place of step 186, whereupon, steps 189 to 192 could be omitted. Steps 44, FIG. 2A, could also be substituted for step 182 or step 197, FIG. 10.

It may be helpful to give the operation of FIG. 10 for the case of a specific example. If ambient temperature of the charge system which is to receive a terminal or battery pack is 20° C. (68° F.) and the pack is initially at 0° C. (32° F.), step 182 will apply until the battery pack reaches a temperature of 10° C. (50° F.). At this time, the temperature differential will be 10° C., and step 193 will be executed. For a battery according to Table II, the value of fast charging current would be 1.314 C. This value would also be selected based on characteristic of FIG. 7.

Step 194 could be performed at suitable time intervals, e.g. one minute intervals. While battery temperature remained below 30° C., the fast charge rate would be successively adjusted (step 193) at e.g. one minute intervals according to Table II if necessary. Between 14° C. and 30° C., the fast charge rate might be at 1.600 C., as also indicated in FIG. 10, where such a charge rate was available from the regulator circuit.

When the battery temperature exceeds 30° C., initially the temperature would exceed room temperature by more than 10° C., and a current of nominal value, e.g. comparable to load current would be selected. As the battery then cooled toward ambient temperature, e.g. below 28° C., current would be set according to step 198, e.g. at 0.300 C. or 360 milliamperes.

Generally, by means of steps 181 to 184, it is insured that the battery has a state such that its temperature will not increase at a substantial rate due to a higher ambient temperature, and that the overcharge condition can be detected by the subsequent step 194.

Step 194 follows step 193 at a suitable limited time interval, e.g. a one-minute interval so as to insure against any substantial detriment to the useful life of the battery, should the battery be in the overcharging condition.

It will be apparent that features of the various embodiments described or incorporated herein may be combined, and that various of the features may be utilized independently of others, and that many further modifications and variations may be effected without departing from the scope of the teachings and concepts of the present disclosure.

We claim as our invention:

1. In a battery conditioning system,
    (a) rechargeable battery means for supplying operating current during portable operation so as to become progressively discharged as a result,
    (b) battery conditioning system means for coupling with said rechargeable battery means for supplying dynamic, charging current to said rechargeable battery means during at least a portion of a battery conditioning cycle, after a period of portable operation,
    (c) said battery conditioning system means comprising computer means having input means for receiving measures of battery and ambient temperature at intervals during such battery conditioning cycle, and
    (d) current control means for coupling with said rechargeable battery means for controlling the rate of current flow to the rechargeable battery means during a battery conditioning cycle,
    (e) said computer means having output means coupled with said current control means for varying the rate of current flow to said rechargeable battery means during a battery conditioning cycle as a function of battery temperature as monitored by said computer means without relying on measured battery voltage, including dynamically varying rate of current flow by successive relatively small incremental changes, as a function of battery temperature during said portion of the battery conditioning cycle to maximize efficiency of recharging,
    (f) wherein said computer means senses a differential between ambient temperature and battery temperature to insure that battery temperature rise will be essentially a function of an overcharge condition of the battery means as substantial current flow rates are supplied to the battery means during a battery conditioning cycle, the substantial current flow rates varying dynamically as a function of battery temperature.

2. In a battery conditioning system according to claim 1, said computer means adjusting said current control means during a battery conditioning operation so as to provide a moderate rate of current flow when the battery temperature is substantially greater than ambient temperature.

3. In a battery conditioning system according to claim 2, said rechargeable battery means comprising nickel-cadmium rechargeable battery means.

4. In a battery conditioning system according to claim 1, said rechargeable battery means comprising nickel-cadmium rechargeable battery means.

5. In a battery conditioning system according to claim 4, said computer means including programming, automatically controlling said current control means so as to avoid extended overcharging of the rechargeable battery means when the differential between ambient temperature and battery temperature is greater than ten degrees celsius.

6. In a battery conditioning system according to claim 1, said computer means including programming, automatically operating so as to avoid substantial extended overcharging of the battery means at extremes in the differential between ambient temperature and battery temperature while providing respective progressively increased values of overcharge current for respective progressively increased values of battery temperature over a substantial range after the differential between ambient temperature and battery temperature has been reduced.

7. In a battery conditioning system according to claim 6, said battery means comprising nickel-cadmium battery means, and said computer means including programming being automatically operative to supply a current flow rate to the battery means not substantially exceeding an overcharge rate for the battery means until such time as battery temperature is generally equal to ambient temperature.

8. The battery conditioning system of claim 1, said computer means further comprising memory means for storing predetermined values of rate of current flow correlated to the specific battery means for incremental changes in measured temperature, wherein said current control means varies the rate of current flow to said rechargeable battery means with reference to the predetermined values.

9. A method of charging a battery means having a temperature characteristic when subject to overcharge current which exhibits a rising temperature as a function of overcharge current duration, said method comprising:
    measuring battery temperature;
    sensing any change in battery temperature which is distinctive of an overcharge condition of the battery means to automatically determine, without relying on measured battery voltage, whether or not the battery means is in the overcharge condition;

measuring ambient temperature at successive times;

applying a relatively high charge rate to said battery means while the battery means is sensed not to be in the overcharge condition, the relatively high charge rate being dynamically adjusted by successive relatively small incremental changes as a function of battery temperature;

comparing battery and ambient temperatures; and applying a relatively lower charge rate to said battery means when the battery means is sensed to be in the overcharge condition, the relatively lower charge rate being dynamically adjusted by successive relatively small incremental changes as a function of the differential between battery temperature and ambient temperature to maintain the battery means substantially in a fully charged condition but to avoid substantial detriment to the useful life of the battery means.

10. The method of claim 9 further comprising the steps of:

pre-selecting a set of relatively high charge rates for given temperatures for a given battery type and capacity;

pre-selecting a set of relatively lower charge rates for given temperatures for a given battery type and capacity;

wherein said relatively high charge rate is applied from the set of relatively high charge rates; and said relatively lower charge rates are applied from the set of relatively lower charge rates.

11. A method of charging a battery means having a temperature characteristic when subject to overcharge current which exhibits a rising temperature as a function of overcharge current duration, said method comprising:

measuring battery temperature at intervals;

sensing any change in battery temperature which is distinctive of an overcharge condition of the battery means to automatically determine whether or not the battery means is in the overcharge condition without relying on measured battery voltage;

measuring ambient temperature;

comparing battery and ambient temperature; and applying a relatively lower charge rate to said battery means when the battery means is sensed to be in the overcharge condition, the relatively lower charge rate being dynamically adjusted by successively small incremental changes as a function of the differential between battery temperature and ambient temperature to maintain the battery means substantially in a fully charged condition but to avoid substantial detriment to the useful life of the battery means.

12. The method of claim 11 wherein the conversion from a relatively high charge rate to a relatively low charge rate is accomplished quickly to avoid detriment to the useful life of the battery means.

13. The method of claim 11 further comprising the step of pre-selecting a set of relatively lower charge rates for given temperatures for a given battery type and capacity wherein said relatively lower charge rate is applied from the set of relatively lower charge rates.

14. A method for fast charging of a rechargeable battery which maintains a battery in a fully charged capacity after charging and deters damage to the useful life of the battery during charging and after charging, comprising:

determining when the battery is in an optimal condition for charging by measuring battery temperature, ambient temperature, and battery voltage to characterize current drain caused by battery load if any, and causing battery temperature to be in a given temperature range;

presenting current to the battery at a relatively fast charge rate to quickly recharge the battery;

monitoring battery temperature at closely repeated intervals to detect any increase of battery temperature which indicates an overcharged condition of the battery without relying on measured battery voltage;

immediately converting the fast charge rate to a relatively lower charge rate upon detection of the overcharge condition; and monitoring battery temperature during overcharge condition and dynamically varying the lower charge rate as a function of battery temperature to provide an optimal charge rate which compensates for any battery load to maintain the battery in a fully charge condition while avoiding substantial detriment to the useful life of the battery.

15. In a battery conditioning system, (a) rechargeable battery means for supplying operating current during portable operation so as to become progressively discharged as a result.

(b) battery conditioning system means for coupling with said rechargeable battery means for supplying current to said rechargeable battery means during a battery conditioning cycle, after a period of portable operation, (c) said battery conditioning system means comprising computer means having input means for receiving measures of battery temperature and ambient at successive time during such battery conditioning cycle, and (d) current control means for coupling with said rechargeable battery means for controlling the rate of current flow to the rechargeable battery means during a battery conditioning cycle, (e) said computer means having output means coupled with said current control means for varying the rate of current flow to said rechargeable battery means during a battery conditioning cycle as a function of battery temperature as monitored by said computer means without relying on measured battery voltage, (f) wherein said computer means senses a differential between ambient temperature and battery temperature to insure that battery temperature rise will be essentially a function of an overcharge condition of the battery means as substantial current flow rates are supplied to the battery means during a battery conditioning cycle, said computer means including programming, and including connection means for obtaining a measure of the voltage of the battery means from a battery voltage measuring means for characterizing current drain caused by battery load, if any, and automatically operating to provide respective successively increased values of current flow rate to compensate for battery load, until such time as battery voltage has stabilized, and maintaining a current flow rate which compensates for battery load until the battery temperature has increased to a elected temperature value suited to fast charging operation.

16. The battery conditioning system of claim 15 wherein said battery means comprises a nickel-cadmium battery means wherein current supplied to the battery means becomes overcharge current when most of the supplied charge causes generation of oxygen gas.

17. A battery recharging system for recharging and maintaining a rechargeable battery to maximum capacity comprising:

rechargeable battery means for providing a stored electric potential;

current control means for providing an adjustable recharging current to the battery means during a recharging period;

computer means for controlling the current control means and monitoring temperature of the battery means and ambient temperature;

input means included with the computer means for receiving successive measurements of battery temperature and ambient temperature at least during the recharging periods;

output means included with the computer means for providing control signals to the current control means during the recharging; and overcharge detection means associated with the computer means for automatically sensing a change of battery temperature which is distinctive of an overcharge condition of the battery means by comparison in the computer means of the successive measurements of battery temperature and ambient temperature communicated to the computer means and without relying on measured battery voltage.

18. The battery recharging system of claim 17 further comprising temperature monitoring means for measuring battery temperature and ambient temperature, including means for operative connection to the input means.

19. The battery recharging system of claim 17 further comprising a portable housing means for containing components of the battery recharging system.

20. The battery recharging system of claim 17 further comprising:

memory means for storing predetermined values of rate of the recharging current correlated to the specific battery means for incremental changes in measured temperature; and wherein said current control means provides a relatively low recharging current according to said predetermined values.

21. A method of charging a battery means having a temperature characteristic when subject to overcharge current which exhibits a rising temperature as a function of overcharge current duration, said method comprising:

supplying charging current at a charge rate to the battery means;

monitoring temperature of battery means at spaced intervals;

monitoring ambient temperature at or near the battery means;

determining an overcharge condition of the battery means by detecting a difference between battery temperature and ambient temperature of a magnitude distinctive of an overcharge condition of the battery means without relying on measured battery voltage; and supplying a relatively lower charge rate when an overcharge condition has been established;

so that protection of the overcharge condition is made independent of any measurement of battery voltage, load, or battery current.

22. The method of claim 21 wherein the steps of monitoring battery temperature and ambient temperature, and determining an overcharge condition are applied to a battery means in a portable, hand-held device.

23. The method of claim of 21 further comprising controlling charge rate to the battery means as a function of battery temperature.

24. The method of claim 21 further comprising controlling charge rate to the battery as a function of whether the battery means is in an overcharge condition.

25. The method of claim 21 further comprising controlling charge rate to the battery means as a function of battery temperature and whether the battery means is in an overcharge condition.

26. The method of claim 21 further comprising controlling charge rate of charging current to the battery means after sensing of the overcharge condition by adjusting the charge rate as a function of battery temperature.

27. The method of claim of 21 further comprising monitoring an initial charge state of the battery means.

28. The method of claim 27 wherein the initial charge state of the battery means is detected by measuring battery voltage.

29. The method of claim of 27 wherein the initial charge state of the battery means is detected by measuring battery temperature.

30. The method of claim 27 further comprising controlling charge rate of recharging current to the battery means after detecting an initial charge state by selecting charge rate as a function of battery temperature.

31. The method of claim of 30 wherein the selection of charge rate is accomplished independently of measurement and detection of current flow through the battery means.

32. The method of claim 21 further comprising the step of:

pre-selecting a set of relatively lower charge rates for a given temperature for a given battery type and capacity; and wherein said relatively lower charge rate is supplied from the set of relatively lower charge rates.

33. A method of charging a battery means which may have a load requiring current during charging operation, said method comprising:

measuring battery temperature at spaced intervals;

measuring ambient temperature;

comparing battery and ambient temperature; and applying a relatively moderate charge rate of recharging current to the battery means, the charge rate being determined between at least two distinct levels as a function of the difference between battery temperature and ambient temperature but without relying on measured battery voltage;

the relatively moderate charging current being dynamically adjusted by successive relatively small incremental changes as a function of a comparison of battery temperature, ambient temperature, and the rate of change of battery temperature.

34. The method of claim 33 wherein the battery means has characteristics which can be stored in a battery identification means which relates to charging parameters of the battery means.

35. The method of claim 34 wherein the charge rate is determined additionally by battery identification.

36. The method of claim 33 wherein the charge rate is additionally determined by current to the load.

37. The method of claim 33 wherein the battery means has a range of safe overcharging current and the charge rate is additionally determined by the range of safe overcharging current.

38. The method of claim 33 wherein the relatively moderate charging current is dynamically adjusted as a function of a comparison of battery temperature and ambient temperature.

39. The method of claim 33 wherein the dynamic adjustment of relatively moderate recharging current is carried on with a periodic monitoring of battery temperature and ambient temperature.

40. The method of claim 39 wherein the dynamic adjustment occurs between at least two discrete current levels.

41. The method of claim 39 wherein the dynamic adjustment occurs between a plurality of incremental current levels.

42. A method of charging a battery means having a temperature characteristic when subject to overcharge current which exhibits a rising temperature as a function of overcharge current duration, the method comprising:

monitoring temperature of the battery means at intervals;

monitoring ambient temperature at or near the battery means;

monitoring rate of change of the temperature of the battery means;

comparing battery temperature and ambient temperature; and determining an overcharge condition of the battery means by detecting a rise in temperature of said battery means of a predetermined rate when said battery means temperature and said ambient temperature are within a predetermined range of one another when charging is initiated by application of charging current to the battery means but without relying on measured battery voltaqe so that protection of the battery means in an overcharged condition is made independent of any measurement of battery voltage, load, or battery current.

43. A method of charging a battery prior to its reaching an overcharge condition, which comprises:

applying recharging current to the battery such that battery temperature may increase as a result;

measuring battery temperature during application of such recharging current at time intervals not exceeding a time interval of the order of one minute; and incrementally adjusting the recharging current as a function of such battery temperature measurement so as to closely follow a schedule of maximum charge rates as a function of battery temperature which applies prior to the battery reaching the overcharge condition but without relying on measured battery voltage.

44. The method according to claim 43 wherein the schedule of maximum charge rate as a function of battery temperature provides changing recharging current values for successive changes in battery temperature of the order of two degrees Celsius.

45. A method of charging a battery once it has reached an overcharge condition comprising:

applying recharging current to the battery such that battery temperature may change as a result;

measuring battery temperature during application of such recharging current at time intervals not exceeding a time interval of the order of one minute; and incrementally adjusting the recharging current as a function of such battery temperature measurements so as to closely follow a schedule of maximum charge rates as a function of battery temperature which applies after the overcharge condition has been reached but relying on measured battery voltage.

46. The method according to claim 45 wherein the schedule of maximum charge rate as a function of battery temperature provides charging recharging current valves for successive charges in battery temperature of the order of two degrees Celsius.

47. The method of charging a battery means which may have a load requiring current during charging operation, said method comprising:

(a) measuring battery voltage to characterize current drain caused by battery load, if any, and applying moderate non-static, non-preset charging current at any stage of recharging to the battery means, (b) measuring battery temperature at successive times and determining whether batter temperature is substantially outside a given temperature range before applying substantial charge to the battery means, and if it is outside such temperature range, (c) sensing whether the applied current has increased battery voltage, and (d) increasing current to the battery means without relying on measured battery voltage by a small increment where battery voltage has not substantially increased within a given time interval.

48. The method of claim 47 further comprising dynamically adjusting current to the battery means until the battery means temperature is within a given temperature range.

49. The method of claim 48 wherein the dynamic adjustment of current is between a plurality of discrete current levels.

50. The method of claim 49 wherein the plurality of discrete levels differ by increments over a range of current values.

51. The method of claim 47 wherein the increased current is taken from a set of current values between relatively low and relatively high current values.

52. The method of claim 51 wherein the relatively low current values are selected when battery temperature is relatively low compared to ambient temperature.

53. The method of claim 51 where the current values are relatively high when battery temperature is relatively high compared to ambient temperature.

\* \* \* \* \*